US012703812B2

(12) United States Patent
Hirose et al.

(10) Patent No.: US 12,703,812 B2
(45) Date of Patent: Aug. 11, 2026

(54) ADHESIVE SHEET, ADHESIVE COMPOSITION, ADHESIVE SHEET WITH RELEASE FILM, LAMINATE FOR IMAGE DISPLAY DEVICE, AND FLEXIBLE IMAGE DISPLAY DEVICE

(71) Applicant: MITSUBISHI CHEMICAL CORPORATION, Tokyo (JP)

(72) Inventors: Kohei Hirose, Tokyo (JP); Akifumi Matsushita, Tokyo (JP); Kouta Taniguchi, Tokyo (JP); Eri Masuda, Tokyo (JP); Nobuaki Kanazawa, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 139 days.

(21) Appl. No.: 18/690,698

(22) PCT Filed: Sep. 13, 2022

(86) PCT No.: PCT/JP2022/034163
§ 371 (c)(1),
(2) Date: Mar. 8, 2024

(87) PCT Pub. No.: WO2023/038147
PCT Pub. Date: Mar. 16, 2023

(65) Prior Publication Data

US 2024/0417600 A1 Dec. 19, 2024

(30) Foreign Application Priority Data

Sep. 13, 2021 (JP) ................................ 2021-148658
Mar. 29, 2022 (JP) ................................ 2022-053716
Mar. 29, 2022 (JP) ................................ 2022-053729

(51) Int. Cl.
*C09J 7/10* (2018.01)
*C09J 7/38* (2018.01)
*H10K 59/80* (2023.01)
*H10K 102/00* (2023.01)

(52) U.S. Cl.
CPC ................ *C09J 7/385* (2018.01); *C09J 7/10* (2018.01); *C09J 2203/326* (2013.01); *C09J 2301/312* (2020.08); *C09J 2301/414* (2020.08); *C09J 2301/416* (2020.08); *H10K 59/80* (2023.02); *H10K 2102/311* (2023.02)

(58) Field of Classification Search
None
See application file for complete search history.

(56) References Cited

U.S. PATENT DOCUMENTS

2009/0093584 A1 4/2009 Gelles et al.
2012/0325402 A1* 12/2012 Suwa ........................ C09J 5/06 156/331.7
2017/0029548 A1 2/2017 Kawai et al.
2019/0077898 A1* 3/2019 Otani ........................ C08F 2/38
2021/0292607 A1 9/2021 Itoh et al.

FOREIGN PATENT DOCUMENTS

JP S63-196676 A 8/1988
JP H01-203412 A 8/1989
JP 2011-500895 A 1/2011
JP 2011-219582 A 11/2011
JP 2017-095660 A 6/2017
JP 2017-119795 A 7/2017
JP 2017-119801 A 7/2017
JP 2018-039999 A 3/2018
JP 2019-123826 A 7/2019
JP 2021-080421 A 5/2021
WO 2006/007999 A2 1/2006
WO 2015/080244 A1 6/2015
WO 2015/155844 A1 10/2015
WO 2020/032287 A1 2/2020
(Continued)

OTHER PUBLICATIONS

Office Action issued in corresponding Japanese Patent Application No. 2021-148658, dated Mar. 18, 2025.
Decision of Rejection issued in corresponding Japanese Patent Application No. 2021-148658, dated Jun. 17, 2025.
International Search Report (PCT/ISA/210) issued in PCT Application No. PCT/JP2022/034163 dated Dec. 6, 2022.
Written Opinion (PCT/ISA/237) issued in PCT Application No. PCT/JP2022/034163 dated Dec. 6, 2022.
Office Action issued in corresponding Taiwanese Patent Application No. 111134518 dated Aug. 27, 2025.
(Continued)

*Primary Examiner* — Sheeba Ahmed

(74) *Attorney, Agent, or Firm* — Morgan, Lewis & Bockius LLP

(57) ABSTRACT

What is provided is an adhesive sheet in which a high level of both unevenness followability during bonding and shape holding power when not bonded is achieved and flexibility especially in a low-temperature environment is excellent. The adhesive sheet includes an adhesive layer formed from an adhesive composition containing a (meth)acrylic copolymer, in which (1) when the thickness is set to 0.7 to 1.0 mm, a strain (creep strain) by applying a pressure of 2 kPa at a temperature of 60° C. for 600 seconds is 1000% or more and 100000% or less, (2) in a holding power measurement in accordance with JIS-Z-0237 (ISO29863), a falling time when the adhesive sheet is adhered to a SUS plate with an area of 20 mm×20 mm and a load of 500 gf is applied in an atmosphere of 40° C. is 60 seconds or more, and (3) when the thickness is set to 0.7 to 1.0 mm, a storage shear modulus at −20° C. (G' (−20° C.)) obtained by a dynamic viscoelasticity measurement in a shear mode at a frequency of 1 Hz is 10 kPa or more and 1000 kPa or less are satisfied.

28 Claims, No Drawings

(56) References Cited

FOREIGN PATENT DOCUMENTS

| | | | |
|---|---|---|---|
| WO | 2020/139673 | A1 | 7/2020 |
| WO | 2020/218372 | A1 | 10/2020 |

OTHER PUBLICATIONS

Office Action issued in corresponding Japanese Patent Application No. 2025-153057, dated Apr. 28, 2026.
Office Action issued in corresponding Vietnamese Patent Application No. 1-2024-01714 dated Jun. 1, 2026.

* cited by examiner

ADHESIVE SHEET, ADHESIVE COMPOSITION, ADHESIVE SHEET WITH RELEASE FILM, LAMINATE FOR IMAGE DISPLAY DEVICE, AND FLEXIBLE IMAGE DISPLAY DEVICE

TECHNICAL FIELD

The present invention relates to an adhesive sheet that can be suitably used for an image display device including a curved surface, a flexible image display device which is foldable, or the like. In particular, the present invention relates to an adhesive sheet which can be suitably used for bonding members for constituting an image display device having an uneven portion on a bonding surface, an adhesive composition, an adhesive sheet with a release film, which includes the adhesive sheet, a laminate for an image display device, and a flexible image display device.

Priority is claimed on Japanese Patent Application No. 2021-148658, filed Sep. 13, 2021, Japanese Patent Application No. 2022-053716, filed Mar. 29, 2022, and Japanese Patent Application No. 2022-053729, filed Mar. 29, 2022, the contents of which are incorporated herein by reference.

BACKGROUND ART

In recent years, in displays for TV or PC and mobile devices such as laptop computers, mobile phones, smartphones, and tablet devices, touch panels in which a display and a position input device are combined have been widely used. Among these, a capacitive touch panel is generally prevalent.

The touch panel is usually composed of a display made of an organic EL or liquid crystal, a transparent conductive film substrate (ITO substrate), and a protective film (protective glass). A transparent adhesive sheet is used for laminating these touch panel members. The transparent adhesive sheet is required to have a holding power of holding an adherend when laminating the members of the touch panel.

In addition, an image display device including a curved portion, which uses an organic light emitting diode (OLED) or a quantum dots (QD), a flexible image display device capable of folding or rolling up, and the like have been developed and widely commercially available.

In such a display device, a plurality of sheet members such as a cover lens, a circular polarizing plate, a contact film sensor, a digitizer, a color filter, and a light emitting element are bonded to each other by a transparent adhesive sheet to form a laminated structure, and when focusing on a certain adhesive sheet, it can be considered as a laminate in which the members and adhesive sheets are laminated.

With regard to the flexible image display device capable of folding or rolling up, various problems due to interlaminar stress when folded have been caused. For example, interlayer peeling (delamination) may occur when the flexible image display device is folded, and there has been a demand for a laminate which does not peel off even when folded.

Furthermore, during repeating folding or rolling up operations, cracks may occur due to stress applied to a member which is the adherend of the adhesive sheet, and may eventually break. Therefore, there has also been a demand for a flexible laminate which can withstand repeated folding operations particularly at low temperatures (for example, −20° C.).

In addition, a surface of the member constituting the image display device (also referred to as "image display device constituent member") may be provided with unevenness due to wiring, printing, pattern development, surface treatment, or the like. When the image display device constituent member provided with such a step is laminated, in a case where followability of the adhesive sheet to the step is low, air bubbles are generated inside an adhesive layer of the adhesive sheet. Therefore, based on restriction that the adhesive sheet cannot be made thick due to the demand for thinner image display device, the adhesive sheet is required to have high fluidity such that it can follow the step and fill the entire area while being thin.

On the other hand, the adhesive sheet having high fluidity has poor shape retention, and there is a problem that the adhesive layer bleeds out from between release films (separate films) during storage before the bonding.

With regard to the flexible image display device capable of winding, for example, Patent Document 1 discloses an adhesive for a repeated bendable device, an adhesive sheet, a bendable layered member, and a repeated bendable device, in which a product value of a creep compliance fluctuation value and a relaxation elastic modulus fluctuation value can be set to be within a suitable range.

In addition, Patent Document 2 discloses an adhesive which can be hot melted and with which an adhesive layer having excellent holding power and adhesive force can be formed, where the adhesive contains a (meth)acrylic copolymer having a weight-average molecular weight of 50,000 to 1,000,000, which is obtained by polymerizing a macromonomer having a number-average molecular weight of 500 or more and less than 6,000 and a monomer mixture containing a vinyl monomer. As the above-described macromonomer, a macromonomer having a constituent unit derived from methyl methacrylate is used.

CITATION LIST

Patent Documents

Patent Document 1

Japanese Unexamined Patent Application, First Publication No. 2019-123826

Patent Document 2

PCT International Publication No. WO2015/080244

SUMMARY OF INVENTION

Technical Problem

When bonding the members to each other through the adhesive layer, for example, an adhesive layer in a state of being sandwiched between a pair of separate films is prepared, one separate film is peeled off and one member is laminated on the adhesive layer, the other separate film is peeled off and the other member is laminated on the adhesive layer, and the obtained laminate is heated and pressurized. The heating temperature at this time is depending on the process, but is, for example, approximately 70° C.

When unevenness is present on at least one surface of the members to be bonded through the adhesive layer, the adhesive layer is required to be deformed by following the unevenness during the bonding. In addition, when the adhesive layer is used for a foldable display, the display may be folded at low temperatures (for example, −20° C.), and flexibility during use at the low temperatures is required.

However, the adhesive containing the (meth)acrylic copolymer, disclosed in Patent Document 1, tends to have insufficient unevenness followability and flexibility during use at the low temperatures.

Even though the product value of the creep compliance fluctuation value and the relaxation elastic modulus fluctuation value in the adhesive sheet is controlled within a suitable range at room temperature as disclosed in Patent Document 1, when repeated folding operations are performed at the low temperatures, since stress is applied to the member which is the adherend of the adhesive sheet, problems such as cracking of the member may occur.

In addition, the adhesive containing the (meth)acrylic copolymer, disclosed in Patent Document 2, tends to have insufficient unevenness followability and flexibility particularly during use at the low temperatures.

It is assumed that a device including the adhesive sheet is used at high temperature due to heat generation of the device, and is used at high temperature and low temperature depending on the environment such as region and season. Therefore, the adhesive sheet is required to have a property of stably exhibiting durability in a wide temperature range.

As a result of studies by the present inventors, when the molecular weight of the above-described (meth)acrylic copolymer is increased, the shape holding power at normal temperature is increased, and it is possible to suppress the bleeding out of the adhesive layer from between the separate films during storage before bonding. However, due to increase in viscosity, a problem that unevenness followability during bonding is reduced occurs. In addition, when a random copolymer is used, by increasing the molecular weight to an extent that the shape holding power is obtained, a solution viscosity or a melt viscosity is too high, so that it is difficult to transfer the solution on a production line and to form a coating film with uniform thickness.

An object of the present invention is to provide an adhesive sheet and an adhesive sheet with a release film, in which a high level of both unevenness followability during bonding and shape holding power when not bonded is achieved and flexibility especially in a low-temperature environment is excellent, and to provide a laminate for an image display device and a flexible image display device using the adhesive sheet.

Another object of the present invention is to provide an adhesive composition with which an adhesive layer having excellent unevenness followability during bonding, excellent shape holding power when not bonded, and excellent flexibility during use at low temperatures can be formed.

Solution to Problem

One embodiment of the present invention includes the following aspects.

[1] An adhesive sheet comprising:

an adhesive layer formed from an adhesive composition containing a (meth)acrylic copolymer, wherein the following requirements (1) to (3) are satisfied, (1) when the thickness is set to 0.7 to 1.0 mm, a strain (creep strain) by applying a pressure of 2 kPa at a temperature of 60° C. for 600 seconds is 1000% or more and 100000% or less, (2) in a holding power measurement in accordance with JIS-Z-0237 (ISO29863), a falling time when the adhesive sheet is adhered to a SUS plate with an area of 20 mm×20 mm and a load of 500 gf is applied in an atmosphere of 40° C. is 60 seconds or more, (3) when the thickness is set to 0.7 to 1.0 mm, a storage shear modulus at −20° C. (G' (−20° C.)) obtained by a dynamic viscoelasticity measurement in a shear mode at a frequency of 1 Hz is 10 kPa or more and 1000 kPa or less.

[2] The adhesive sheet according to [1], wherein the (meth)acrylic copolymer is a block copolymer or a graft copolymer, which has a segment (A) including a constituent unit derived from an alkyl (meth)acrylate (a) having an alkyl group having 8 or more and 30 or less carbon atoms.

[3] The adhesive sheet according to [2], wherein the proportion of the constituent unit derived from the alkyl (meth)acrylate (a) to 100% by mass of all constituent units constituting the segment (A) is 70% by mass or more.

[4] The adhesive sheet according to [2] or [3], wherein the (meth)acrylic copolymer has a segment (A) having a constituent unit derived from a macromonomer (A1), and the macromonomer (A1) includes the constituent unit derived from the alkyl (meth)acrylate (a).

[5] The adhesive sheet according to any one of [2] to [4], wherein the (meth)acrylic copolymer includes, as a constituent unit other than the segment (A), a constituent unit derived from a vinyl monomer (B), and the constituent unit derived from the vinyl monomer (B) includes a constituent unit derived from an alkyl (meth) acrylate (B1) having an alkyl group having 6 or more and 30 or less carbon atoms and a constituent unit derived from a vinyl monomer (B2) including a polar group.

[6] The adhesive sheet according to [1], wherein the (meth)acrylic copolymer includes a constituent unit derived from an alkyl (meth)acrylate (a) having an alkyl group having 8 or more and 30 or less carbon atoms and a constituent unit derived from a vinyl monomer (B) other than the alkyl (meth)acrylate (a), and the constituent unit derived from the vinyl monomer (B) includes a constituent unit derived from a vinyl monomer (B2) including a polar group.

[7] The adhesive sheet according to any one of [1] to [6], wherein the adhesive layer is a layer formed from an adhesive composition which contains a (meth)acrylic copolymer and at least one of a crosslinking agent and a photopolymerization initiator.

[8] The adhesive sheet according to [7], wherein the crosslinking agent is a polyfunctional (meth) acrylate.

[9] The adhesive sheet according to [7] or [8], wherein the amount of the crosslinking agent is 0.1 parts by mass or more and 10 parts by mass or less with respect to 100 parts by mass of the (meth)acrylic copolymer.

[10] The adhesive sheet according to any one of [1] to [9], wherein the adhesive layer has active energy ray-curability, and the following requirements (4) and (5) are satisfied after curing the adhesive sheet with active energy ray, (4) when the adhesive sheet is irradiated with active energy ray having a wavelength of 365 nm with an integrated light amount of 1000 to 5000 $mJ/cm^2$, a storage shear modulus at −20° C. (G' (−20° C.)) obtained by a dynamic viscoelasticity measurement in a shear mode at a frequency of 1 Hz is 10 kPa or more and 1000 kPa or less, (5) when the adhesive sheet is irradiated with active energy ray having a wavelength of 365 nm with an integrated light amount of 1000 to 5000 mJ/$cm^2$, and then the irradiated adhesive sheet is bonded to a polyester film, th adhesive force to a surface of the polyester film at 60° C., 93% RH, a peeling angle of 180°, and a peeling speed of 300 mm/min is 0.7 N/cm or more.

[11] An adhesive composition comprising:

a (meth)acrylic copolymer having a constituent unit derived from a macromonomer (A1) and a constituent unit derived from a vinyl monomer (B), wherein the macromonomer (A1) has a constituent unit derived from an alkyl (meth)acrylate (a) having an alkyl group having 8 or more and 30 or less carbon atoms, and the glass transition temperature (Tg) of the macromonomer (A1) is lower than 0° C.

[12] An adhesive composition comprising:

a (meth)acrylic copolymer having a constituent unit derived from a macromonomer (A1) and a constituent unit derived from a vinyl monomer (B), wherein the constituent unit derived from the macromonomer (A1) includes a constituent unit derived from an alkyl (meth)acrylate having an alkyl group having 8 or more carbon atoms, and the constituent unit derived from the vinyl monomer (B) includes a constituent unit derived from an alkyl (meth) acrylate having an alkyl group having 6 or more carbon atoms.

[13] The adhesive composition according to [11] or [12], wherein the (meth)acrylic copolymer includes a constituent unit derived from a vinyl monomer (B2) including a polar group.

[14] The adhesive composition according to any one of [11] to [13], wherein the proportion of the constituent unit derived from the macromonomer (A1) to 100% by mass of all constituent units constituting the (meth)acrylic copolymer is 1% to 30% by mass.

[15] The adhesive composition according to any one of [11] to [14], wherein the constituent unit derived from the macromonomer (A1) includes a constituent unit derived from an alkyl (meth)acrylate (a1) having an alkyl group having 12 or more and 30 or less carbon atoms.

[16] The adhesive composition according to [15], wherein the proportion of the constituent unit derived from the alkyl (meth)acrylate (a1) to 100% by mass of all constituent units constituting the macromonomer (A1) is 40% by mass or more.

[17] The adhesive composition according to any one of [11] to [16], wherein the constituent unit derived from the vinyl monomer (B) includes a constituent unit derived from an alkyl (meth)acrylate (B1) having an alkyl group having 6 or more and 30 or less carbon atoms, and the proportion of the constituent unit derived from the alkyl (meth)acrylate (B1) to 100% by mass of all constituent units constituting the (meth)acrylic copolymer is 10% by mass or more.

[18] The adhesive composition according to any one of [11] to [17], wherein the constituent unit derived from the vinyl monomer (B) includes a constituent unit derived from an alkyl (meth)acrylate (B3-1) having an alkyl group having 1 to 4 carbon atoms.

[19] The adhesive composition according to [18], wherein the proportion of the constituent unit derived from the alkyl (meth)acrylate (B3-1) to 100% by mass of all constituent units derived from the vinyl monomer (B) is 50% by mass or more.

[20] The adhesive composition according to [13], wherein the proportion of the constituent unit derived from the vinyl monomer (B2) including a polar group to 100% by mass of all constituent units constituting the (meth)acrylic copolymer is 1% to 80% by mass.

[21] The adhesive composition according to any one of [11] to [20], wherein the number-average molecular weight of the macromonomer (A1) is 1,000 to 30,000.

[22] The adhesive composition according to any one of [11] to [21], wherein the weight-average molecular weight of the (meth)acrylic copolymer is 50,000 to 2,000,000.

[23] The adhesive composition according to [11] or [12], wherein a deformation amount of the (meth)acrylic copolymer is 15% or less in a creep test under conditions of 23° C., 100 Pa, and 10 minutes, a deformation amount of the (meth)acrylic copolymer is 100% or more in a creep test under conditions of 70° C., 1000 Pa, and 1 minute, and a storage modulus G' of the (meth)acrylic copolymer at −20° C. and 1 Hz is 700 kPa or less.

[24] The adhesive composition according to [11] or [12], wherein the adhesive composition is for bonding a member having unevenness on a surface and a member having an organic light emitting diode.

[25] An adhesive sheet comprising:

an adhesive layer composed of the adhesive composition according to [11] or [12].

[26] An adhesive sheet with a release film, comprising:

the adhesive sheet according to any one of [1] to [10]; and a release film laminated on at least one surface of the adhesive sheet.

[27] A laminate for an image display device, comprising:

two members for constituting an image display device; and the adhesive sheet according to any one of [11] to [10], wherein the two members are laminated through the adhesive sheet, and at least one of the members for constituting an image display device has a step with a height difference of 2 μm or more on a contact surface with the adhesive sheet.

[28] A flexible image display device comprising:

the laminate for an image display device according to [27].

Another embodiment of the present invention includes the following aspects.

[A1] An adhesive sheet comprising:

an adhesive layer formed from an adhesive composition containing a (meth)acrylic copolymer, wherein the following requirements (1) to (3) are satisfied, (1) when the thickness is set to 0.7 to 1.0 mm, a strain (creep strain) by applying a pressure of 2 kPa at a temperature of 60° C. for 600 seconds is 1000% or more and 100000% or less, (2) in a holding power measurement in accordance with JIS-Z-0237 (ISO29863), a falling time when the adhesive sheet is adhered to a SUS plate with an area of 20 mm×20 mm and a load of 500 gf is applied in an atmosphere of 40° C. is 60 seconds or more, (3) when the thickness is set to 0.7 to 1.0 mm, a storage shear modulus at −20° C. (G' (−20° C.)) obtained by a dynamic viscoelasticity measurement in a shear mode at a frequency of 1 Hz is 10 kPa or more and 1000 kPa or less.

[A2] The adhesive sheet according to [A1], wherein the (meth)acrylic copolymer is a block copolymer or a graft copolymer, which has a segment (A) including a constituent unit derived from an alkyl (meth)acrylate (a) having an alkyl group having 8 or more and 30 or less carbon atoms.

[A3] The adhesive sheet according to [A2], wherein the proportion of the constituent unit derived from the alkyl (meth)acrylate (a) to 100% by mass of all constituent units constituting the segment (A) is 70% by mass or more.

[A4] The adhesive sheet according to [A2] or [A3], wherein the (meth)acrylic copolymer has a segment (A) having a constituent unit derived from a macromonomer (A1), and the macromonomer (A1) has the constituent unit derived from the alkyl (meth)acrylate (a).

[A5] The adhesive sheet according to any one of [A2] to [A4], wherein the (meth)acrylic copolymer includes, as a constituent unit other than the segment (A), a constituent unit derived from a vinyl monomer (B), and the constituent unit derived from the vinyl monomer (B) includes a constituent unit derived from an alkyl (meth) acrylate (B1) having an alkyl group having 6 or more and 30 or less carbon atoms and a constituent unit derived from a vinyl monomer (B2) including a polar group.

[A6] The adhesive sheet according to [A1], wherein the (meth)acrylic copolymer includes a constituent unit derived from the alkyl (meth)acrylate (a) having an alkyl group having 8 or more and 30 or less carbon atoms and a constituent unit derived from a vinyl monomer (B) as a constituent unit other than the alkyl (meth)acrylate (a), and the constituent unit derived from the vinyl monomer (B) includes a constituent unit derived from a vinyl monomer (B2) including a polar group.

[A7] The adhesive sheet according to any one of [A1] to [A6], wherein the adhesive layer is a layer formed from an adhesive composition which contains a (meth)acrylic copolymer and at least one of a crosslinking agent and a photopolymerization initiator.

[A8] The adhesive sheet according to [A7], wherein the crosslinking agent is a polyfunctional (meth) acrylate.

[A9] The adhesive sheet according to [A7] or [A8], wherein the amount of the crosslinking agent is 0.1 parts by mass or more and 10 parts by mass or less with respect to 100 parts by mass of the (meth)acrylic copolymer.

[A10] The adhesive sheet according to any one of [A1] to [A9], wherein the adhesive layer has active energy ray-curability, and the following requirements (4) and (5) are satisfied after curing the adhesive sheet with active energy ray, (4) when the adhesive sheet is irradiated with active energy ray having a wavelength of 365 nm with an integrated light amount of 1000 to 5000 mJ/cm$^2$, a storage shear modulus at −20° C. (G' (−20° C.)) obtained by a dynamic viscoelasticity measurement in a shear mode at a frequency of 1 Hz is 10 kPa or more and 1000 kPa or less, (5) when the adhesive sheet is irradiated with active energy ray having a wavelength of 365 nm with an integrated light amount of 1000 to 5000 mJ/cm$^2$, and then the irradiated adhesive sheet is bonded to a polyester film, an adhesive force to a surface of the polyester film at 60° C., 93% RH, a peeling angle of 180°, and a peeling speed of 300 mm/min is 0.7 N/cm or more.

[A11] An adhesive sheet formed from an adhesive composition, the adhesive sheet comprising:

an adhesive layer formed from an adhesive composition containing a (meth)acrylic copolymer, wherein the (meth)acrylic copolymer has a constituent unit derived from a macromonomer (A1) and a constituent unit derived from a vinyl monomer (B), and the macromonomer (A1) has a constituent unit derived from an alkyl (meth)acrylate (a) having an alkyl group having 8 or more and 30 or less carbon atoms.

[A12] The adhesive sheet according to [A11], wherein the constituent unit derived from the vinyl monomer (B) includes a constituent unit derived from an alkyl (meth)acrylate (B1) having an alkyl group having 6 or more and 30 or less carbon atoms.

[A13] The adhesive sheet according to [A12], wherein the proportion of the constituent unit derived from the alkyl (meth)acrylate (B1) to 100% by mass of all constituent units constituting the (meth)acrylic copolymer is 10% by mass or more and 90% by mass or less.

[A14] The adhesive sheet according to [A12] or [A13], wherein the constituent unit derived from the vinyl monomer (B) further includes a constituent unit derived from a vinyl monomer (B2) having a polar group.

[A15] The adhesive sheet according to [A14], wherein the proportion of the constituent unit derived from the vinyl monomer (B2) to 100% by mass of all constituent units constituting the (meth)acrylic copolymer is 1% by mass or more and 80% by mass or less.

[A16] The adhesive sheet according to [A14] or [A15], wherein the polar group is at least one selected from the group consisting of a hydroxyl group, a polyalkylene glycol group, a carboxy group, an amide group, and an amino group.

[A17] The adhesive sheet according to any one of [A14] to [A16], wherein the constituent unit derived from the vinyl monomer (B2) includes a constituent unit derived from a hydroxyalkyl (meth)acrylate.

[A18] The adhesive sheet according to any one of [A11] to [A17], wherein the proportion of the constituent unit derived from the macromonomer (A1) to 100% by mass of all constituent units constituting the (meth) acrylic copolymer is 1% by mass or more and 30% by mass or less.

[A19] The adhesive sheet according to any one of [A11] to [A18], wherein the constituent unit derived from the vinyl monomer (B) includes a constituent unit derived from a vinyl monomer (B3) other than the alkyl (meth)acrylate (B1) having an alkyl group having 6 or more and 30 or less carbon atoms and the vinyl monomer (B2) having a polar group.

[A20] The adhesive sheet according to any one of [A11] to [A19], wherein the number-average molecular weight of the macromonomer (A1) is 1,000 or more and 30,000 or less.

[A21] The adhesive sheet according to any one of [A11] to [A20], wherein the weight-average molecular weight of the (meth)acrylic copolymer is 50,000 or more and 2,000,000 or less.

[A22] An adhesive sheet with a release film, comprising:

the adhesive sheet according to any one of [A1] to [A21]; and a release film laminated on at least one surface of the adhesive sheet.

[A23] A laminate for an image display device, comprising:

two members for constituting an image display device; and the adhesive sheet according to any one of [A1] to [A21], wherein the two members are laminated through the adhesive sheet, and at least one of the members for constituting an image display device has a step with a height difference of 2 μm or more on a contact surface with the adhesive sheet.

[A24] A flexible image display device comprising:

the laminate for an image display device according to [A23].

Another embodiment of the present invention includes the following aspects.

[B1] An adhesive composition comprising:

a (meth)acrylic copolymer having a constituent unit derived from a macromonomer (A1) and a constituent unit derived from a vinyl monomer (B), wherein the macromonomer (A1) has a constituent unit derived from an alkyl (meth)acrylate (a) having an alkyl group having 8 to 30 carbon atoms.

[B2] The adhesive composition according to [B1], wherein the proportion of the constituent unit derived from the alkyl (meth)acrylate (a) to 100% by mass of all constituent units constituting the macromonomer (A1) is 70% by mass or more.

[B3] The adhesive composition according to [B1] or [B2], wherein the constituent unit derived from the alkyl (meth) acrylate (a) includes a constituent unit derived from an alkyl (meth)acrylate (a1) having an alkyl group having 12 to 30 carbon atoms.

[B4] The adhesive composition according to [B3], wherein the proportion of the constituent unit derived from the alkyl (meth)acrylate (a1) to 100% by mass of all constituent units constituting the macromonomer (A1) is 40% by mass or more.

[B5] The adhesive composition according to any one of [B1] to [B4], wherein the constituent unit derived from the vinyl monomer (B) includes a constituent unit derived from an alkyl (meth)acrylate (B3-1) having an alkyl group having 1 to 4 carbon atoms.

[B6] The adhesive composition according to [B5], wherein the proportion of the constituent unit derived from the alkyl (meth)acrylate (B3-1) to 100% by mass of all constituent units derived from the vinyl monomer (B) is 50% by mass or more.

[B7] The adhesive composition according to any one of [B1] to [B6], wherein the number-average molecular weight of the macromonomer (A1) is 1,000 to 30,000.

[B8] The adhesive composition according to any one of [B1] to [B7], wherein the weight-average molecular weight of the (meth)acrylic copolymer is 50,000 to 2,000,000.

[B9] The adhesive composition according to any one of [B1] to [B8], wherein a deformation amount of the (meth)acrylic copolymer is 15% or less in a creep test under conditions of 23° C., 100 Pa, and 10 minutes, a deformation amount of the (meth)acrylic copolymer is 100% or more in a creep test under conditions of 70° C., 1000 Pa, and 1 minute, and a storage modulus G' of the (meth)acrylic copolymer at −20° C. and 1 Hz is 700 kPa or less.

[B10] The adhesive composition according to any one of [B1] to [B9], wherein the adhesive composition is for bonding a member having unevenness on a surface and a member having an organic light emitting diode.

In addition, as a result of intensive studies, the present inventors have obtained the following results.

In a polymer in which dissimilar polymer components are covalently bonded, such as the (meth)acrylic copolymer disclosed in Patent Document 1, a structure known as a microphase-separation structure, in which a minor component is a nanometer-order domain and a main component is a matrix is formed by self-aggregation. In a state in which the microphase-separation structure is formed, as compared with a state in which the microphase-separation structure is not formed, the copolymer is less likely to flow and the shape holding power is improved, and bleeding out of the adhesive layer is suppressed.

By using an alkyl (meth)acrylate having a long-chain alkyl group as a monomer forming a branch polymer (macromonomer), flexibility during use at the low temperatures is improved.

Furthermore, by using an alkyl (meth)acrylate having a medium-chain or long-chain alkyl group in a backbone polymer, the flexibility during use at the low temperatures is further improved. On the other hand, by using only the alkyl (meth)acrylate having a medium-chain or long-chain alkyl group, a difference in polarity between the backbone polymer and the branch polymer is small, phase separation force is weak, and the shape holding power is decreased.

Therefore, in order to make a difference in polarity between the branch polymer and the backbone polymer to increase the phase separation force, a polar group is introduced into the backbone polymer. As a result, the shape holding power is improved.

Another embodiment of the present invention includes the following aspects.

[C1] An adhesive composition comprising:

a (meth)acrylic copolymer having a constituent unit derived from a macromonomer (A1) and a constituent unit derived from a vinyl monomer (B), wherein the macromonomer (A1) has a constituent unit derived from an alkyl (meth)acrylate (a) having an alkyl group having 8 to 30 carbon atoms, and the constituent unit derived from the vinyl monomer (B) includes a constituent unit derived from an alkyl (meth) acrylate (B1) having an alkyl group having 6 to 30 carbon atoms and a constituent unit derived from a vinyl monomer (B2) having a polar group.

[C2] The adhesive composition according to [C1], wherein the proportion of the constituent unit derived from the macromonomer (A1) to 100% by mass of all constituent units constituting the (meth)acrylic copolymer is 1% to 30% by mass.

[C3] The adhesive composition according to [C1] or [C2], wherein the proportion of the constituent unit derived from the alkyl (meth)acrylate (B1) to 100% by mass of all constituent units constituting the (meth)acrylic copolymer is 10% to 90% by mass.

[C4] The adhesive composition according to any one of [C1] to [C3], wherein the proportion of the constituent unit derived from the vinyl monomer (B2) to 100% by mass of all constituent units constituting the (meth)acrylic copolymer is 1% to 80% by mass.

[C5] The adhesive composition according to any one of [C1] to [C4], wherein the polar group is at least one selected from the group consisting of a hydroxyl group, a polyalkylene glycol group, a carboxy group, and an amino group.

[C6] The adhesive composition according to any one of [C1] to [C5], wherein the constituent unit derived from the vinyl monomer (B2) includes a constituent unit derived from a hydroxyalkyl (meth)acrylate.

[C7] The adhesive composition according to any one of [C1] to [C6], wherein the constituent unit derived from the vinyl monomer (B) includes a constituent unit derived from a vinyl monomer (B3) other than the alkyl (meth)acrylate (B1) and the vinyl monomer (B2).

[C8] The adhesive composition according to any one of [C1] to [C7], wherein the number-average molecular weight of the macromonomer (A1) is 1,000 to 30,000.

[C9] The adhesive composition according to any one of [C1] to [c8], wherein the weight-average molecular weight of the (meth)acrylic copolymer is 50,000 to 2,000,000.

[C10] The adhesive composition according to any one of [C1] to [C9], wherein the adhesive composition is for bonding a member having unevenness on a surface and a member having an organic light emitting diode.

Advantageous Effects of Invention

According to the present invention, it is possible to provide an adhesive sheet and an adhesive sheet with a release film, in which a high level of both unevenness followability during bonding and shape holding power when not bonded is achieved and flexibility especially in a low-temperature environment is excellent, and to provide a laminate for an image display device and a flexible image display device using the adhesive sheet.

In addition, according to the present invention, it is possible to provide an adhesive composition with which an adhesive layer having excellent unevenness followability during bonding, excellent shape holding power when not bonded, and excellent flexibility during use at low temperatures can be formed.

DESCRIPTION OF EMBODIMENTS

Definitions of the following terms apply throughout the specification and claims.

"(Meth)acrylate" is a generic term for acrylate and methacrylate. The same applies to "(meth)acryloyl group", "(meth)acrylic acid", "(meth)acrylonitrile", and "(meth) acrylamide".

"(Meth)acrylic copolymer" means a copolymer having a constituent unit derived from a (meth)acrylic monomer. The (meth)acrylic copolymer may further have constituent units derived from monomers other than (meth)acrylic monomers (for example, styrene and the like).

"(Meth)acrylic monomer" means a monomer having a (meth)acryloyl group.

"Vinyl monomer" means a compound having an ethylenically unsaturated bond (polymerizable carbon-carbon double bond).

"to" indicating a numerical range means that the numerical values described before and after "to" are included as the lower limit value and the upper limit value.

<Adhesive Sheet>

An embodiment of the present invention relates to an adhesive sheet.

The adhesive sheet according to the embodiment includes an adhesive layer formed from an adhesive composition containing a (meth)acrylic copolymer.

The adhesive sheet according to the embodiment satisfies the following requirement (1).

(1) When the thickness is set to 0.7 to 1.0 mm, a strain (creep strain) by applying a pressure of 2 kPa at a temperature of 60° C. for 600 seconds is 1000% or more and 100000% or less.

Since the adhesive sheet satisfying the requirement (1) is easily deformed and has excellent unevenness followability during bonding, even when an image display device constituent member to be an adherend has unevenness on a surface, the adhesive sheet can be made to follow the entire area of a step.

From the viewpoint of unevenness followability of the adhesive sheet, the creep strain in the requirement (1) is preferably 2000% or more, more preferably 3000% or more, and still more preferably 5000% or more. On the other hand, from the viewpoint of shape retention of the adhesive sheet at room temperature or lower, the creep strain in the requirement (1) is preferably 50000% or less, more preferably 20000% or less, and still more preferably 10000% or less. The above-described lower limit and upper limit of the creep strain in the requirement (1) can be arbitrarily combined. For example, the creep strain in the requirement (1) is preferably 2000% to 50000%, more preferably 3000% to 20000%, and still more preferably 5000% to 10000%.

In order to accurately measure the creep strain, it is necessary to avoid fluctuations in measurement results due to influence of a measurement jig by insufficient thickness of the adhesive sheet. The requirement (1) is a value measured after adjusting the thickness to a range of 0.7 to 1.0 mm, and thus the creep strain can be accurately measured without being affected by the measurement jig.

The above-described "when the thickness is set to 0.7 to 1.0 mm" means that, when the thickness of the adhesive sheet used as a measurement sample is not within this range, the thickness of the measurement sample is adjusted to within this range by stacking several sheets. The same applies to other tests when the thickness of the measurement sample is defined.

The measurement of the creep strain in the requirement (1) is carried out as follows, for example.

After repeatedly laminating the adhesive sheet to adjust the thickness thereof to 0.7 to 1.0 mm (for example, 0.8 mm), a circular-shaped sample having a diameter of 8 mm is punched out. A strain (creep strain) (%) of the obtained sample after 600 seconds is measured using a rheometer under the conditions of a measurement jig of 8 mm-diameter parallel plate, a temperature of 60° C., and a pressure of 2 kPa.

The adhesive sheet according to the embodiment further satisfies the following requirement (2).

(2) In a holding power measurement in accordance with JIS-Z-0237 (ISO29863), a falling time when the adhesive sheet is adhered to a SUS plate with an area of 20 mm×20 mm and a load of 500 gf is applied in an atmosphere of 40° C. is 60 seconds or more.

The adhesive sheet satisfying the requirement (2) has high shape holding power when not bonded, and the bleeding out of the adhesive layer from the release film during storage before lamination is suppressed.

From the viewpoint of shape holding power of the adhesive sheet before bonding, the falling time in the requirement (2) is preferably 80 seconds or more, more preferably 150 seconds or more, still more preferably 200 seconds or more, and particularly preferably 300 seconds or more. On the other hand, from the viewpoint of unevenness followability of the adhesive sheet, the falling time in the requirement (2) is preferably 1800 seconds or less, more preferably 1500 seconds or less, and still more preferably 1200 seconds or less. The above-described lower limit and upper limit of the falling time in the requirement (2) can be arbitrarily combined. For example, the falling time in the requirement (2) is preferably 60 to 1800 seconds, more preferably 80 to 1800 seconds, still more preferably 150 to 1500 seconds, and particularly preferably 200 to 1200 seconds.

The measurement of the falling time in the requirement (2) is carried out as follows, for example.

A polyester film for backing is attached to one surface of the adhesive sheet, and the adhesive sheet is cut into strips with a width of 20 mm and a length of 100 mm to obtain a test piece. One end portion of the above-described test piece is adhered to a SUS plate such that an adhesive area is 20 mm×20 mm. After curing for 15 minutes in an atmosphere of 40° C., a weight of 500 gf (4.9 N) is provided at the other end portion of the above-described test piece. The SUS plate is placed in a vertical direction such that the weight side is bottom, and a time (seconds) from when a load is applied to the test piece by the weight until the test piece is peeled off and the weight falls is measured.

The adhesive sheet according to the embodiment further satisfies the following requirement (3).

(3) When the thickness is set to 0.7 to 1.0 mm, a storage shear modulus at −20° C. (G' (−20° C.)) obtained by a dynamic viscoelasticity measurement in a shear mode at a frequency of 1 Hz is 10 kPa or more and 1000 kPa or less.

The adhesive sheet satisfying the requirement (3) is flexible even at a low temperature, and for example, even when repeated folding operations at a low temperature of −20° C. is performed, cracks or breakage of a member which is an adherend of the adhesive sheet is less likely to occur.

From the viewpoint of shape holding power of the adhesive sheet when not bonded, the G' (−20° C.) in the requirement (3) is preferably 30 kPa or more, more preferably 50 kPa or more, and still more preferably 100 kPa or more. On the other hand, from the viewpoint of flexibility of the adhesive sheet in a low-temperature environment, the G' (−20° C.) in the requirement (3) is preferably 500 kPa or less, more preferably 300 kPa or less, still more preferably 250 kPa or less, and particularly preferably 200 kPa or less. The above-described lower limit and upper limit of the G' (−20° C.) in the requirement (3) can be arbitrarily combined. For example, the G' (−20° C.) in the requirement (3) is preferably 30 to 500 kPa, more preferably 30 to 300 kPa, still more preferably 50 to 250 kPa, and particularly preferably 100 to 200 kPa.

The measurement of the G' (−20° C.) in the requirement (3) is carried out as follows, for example.

After repeatedly laminating the adhesive sheet to adjust the thickness thereof to 0.7 to 1.0 mm (for example, 0.8 mm), a circular-shaped sample having a diameter of 8 mm is punched out. A dynamic viscoelasticity measurement of the obtained sample is performed using a rheometer under the conditions of a measurement jig of 8 mm-diameter parallel plate, a frequency of 1 Hz, a measurement temperature of −50° C. to 150° C., and a temperature rising rate of 5° C./min, and a value of storage shear modulus (G') at −20° C. is read.

With regard to the adhesive sheet, as a method for adjusting the creep strain in the requirement (1), the falling time in the requirement (2), and the G' (−20° C.) in the requirement (3) to be within the above-described ranges, for example, a method of adjusting the formulation or molecular weight of the (meth)acrylic copolymer, or the type or addition amount of the crosslinking agent, a method of, when a temporary curing is carried out, adjusting the irradiation amount of active energy ray for the temporary curing, and the like can be exemplary examples. However, the method is not limited to these methods.

In the adhesive sheet according to the embodiment, it is preferable that the adhesive layer has curability with active energy ray. Here, the "adhesive layer has curability with active energy ray" means that the adhesive layer has a property of being cured by active energy ray, and in other words, that the adhesive layer has room to be cured by active energy ray.

The adhesive sheet according to the embodiment may be a cured product in which the adhesive layer has room to be cured by active energy ray (hereinafter, also referred to as "temporary cured"), or may be a cured product in which the adhesive layer is not cured (hereinafter, also referred to as "uncured") and can be cured by active energy ray. The temporary cured or uncured adhesive sheet can be cured by irradiating active energy ray before or after being bonded to an adherend (hereinafter, also referred to as "fully cured").

From the viewpoint that it is easier to follow unevenness of an adhered surface before the fully curing with active energy ray, it is preferable that the adhesive layer constituting a part or all of the adhesive sheets according to the embodiment is in a non-crosslinked state.

On the other hand, from the viewpoint of obtaining excellent storage stability, it is preferable to be in a temporarily cured crosslinked state before the fully curing.

When the adhesive sheet is temporary cured, the temporary curing may be carried out by heat or by active energy ray. From the viewpoint of easily controlling the creep strain in the requirement (1) and the holding power in the requirement (2) to a predetermined range, an adhesive sheet temporary cured by irradiation with active energy ray is preferable.

When the adhesive sheet is temporary cured by active energy ray, the temporary curing is preferably carried out by irradiation with active energy ray with an integrated light amount of 10 to 800 $mJ/cm^2$. In such an irradiation with active energy ray, the integrated light amount is preferably 50 mJ/$cm^2$ or more and 600 mJ/$cm^2$ or less, more preferably 100 mJ/$cm^2$ or more and 500 mJ/$cm^2$ or less, particularly preferably 150 mJ/$cm^2$ or more and 400 mJ/$cm^2$ or less, and still more preferably 200 mJ/$cm^2$ or more and 300 mJ/$cm^2$ or less. When the integrated light amount is within the above-described range, there is a tendency that the storage stability can be ensured while having fluidity, which is preferable. The above-described lower limit and upper limit of the irradiation amount of active energy ray can be arbitrarily combined.

When the irradiation with active energy ray is carried out from both sides of the adhesive sheet, the above-described irradiation amount of active energy ray is the sum of integrated light amount on one side and integrated light amount on the other side.

A cured product of the adhesive sheet according to the embodiment after being cured by active energy ray (after the fully curing) preferably satisfies the following requirement (4).

(4) When the adhesive sheet is irradiated with active energy ray having a wavelength of 365 nm with an integrated light amount of 1000 to 5000 mJ/$cm^2$, a storage shear modulus at −20° C. (G' (−20° C.)) obtained by a dynamic viscoelasticity measurement in a shear mode at a frequency of 1 Hz is 10 kPa or more and 1000 kPa or less.

The adhesive sheet satisfying the requirement (4) has excellent flexibility in a low-temperature environment even after curing, and for example, even when repeated folding operations at a low temperature of −20° C. is performed, cracks or breakage of a member which is an adherend of the adhesive sheet is less likely to occur.

From the viewpoint of durability of the adhesive sheet after bonding, the G' (−20° C.) in the requirement (4) is preferably 30 kPa or more, more preferably 50 kPa or more, and still more preferably 100 kPa or more. On the other hand, from the viewpoint of flexibility in a low-temperature environment, the G' (−20° C.) in the requirement (4) is preferably 500 kPa or less, more preferably 300 kPa or less, still more preferably 250 kPa or less, and particularly preferably 200 kPa or less. The above-described lower limit and upper limit of the G' (−20° C.) in the requirement (4) can be arbitrarily combined. For example, the G' (−20° C.) in the requirement (4) is preferably 30 to 500 kPa, more preferably 30 to 300 kPa, still more preferably 50 to 250 kPa, and particularly preferably 100 to 200 kPa.

The measurement of the G' (−20° C.) in the requirement (4) is carried out as follows, for example.

The adhesive sheet is irradiated with ultraviolet light having a wavelength of 365 nm using a high-pressure mercury lamp such that an integrated light amount is 1000 to 5000 mJ/$cm^2$ (for example, 4000 mJ/$cm^2$), and after repeatedly laminating the adhesive sheet after the curing to adjust the thickness thereof to 0.7 to 1.0 mm, a circular-shaped sample having a diameter of 8 mm is punched out. A dynamic viscoelasticity measurement of the obtained sample is performed using a rheometer under the conditions of a measurement jig of 8 mm-diameter parallel plate, a frequency of 1 Hz, a measurement temperature of −50° C. to 150° C., and a temperature rising rate of 5° C./min, and a value of storage shear modulus (G') at −20° C. is read.

As a method for adjusting the G' (−20° C.) in the requirement (4), for example, a method of adjusting the formulation or molecular weight of the (meth)acrylic copolymer, or the type or addition amount of the crosslinking agent, a method of adjusting the irradiation amount of active energy ray, and the like can be exemplary examples. However, the method is not limited to these methods.

The cured product of the adhesive sheet according to the embodiment after being cured by active energy ray (after the fully curing) preferably further satisfies the following requirement (5).

(5) When the adhesive sheet is irradiated with active energy ray having a wavelength of 365 nm with an integrated light amount of 1000 to 5000 mJ/$cm^2$, and then the irradiated adhesive sheet is bonded to a polyester film, an adhesive force to a surface of the polyester film at 60° C., 93% RH, a peeling angle of 180°, and a peeling speed of 300 mm/min is 0.7 N/cm or more.

Since the adhesive sheet satisfying the requirement (5) has excellent adhesiveness and delamination is less likely to occur even when a laminate bonded to an adherend such as an image display device constituent member is folded, durability is excellent.

From the viewpoint of adhesiveness of the adhesive sheet, the adhesive force in the requirement (5) is preferably 0.7 N/cm or more, more preferably 0.8 N/cm or more, and still more preferably 0.9 N/cm or more. The upper limit of the adhesive force in the requirement (5) is not particularly limited, and can be, for example, 20 N/cm or less. For example, the adhesive force in the requirement (5) is preferably 0.7 to 20 N/cm, more preferably 0.8 to 20 N/cm, and still more preferably 0.9 to 20 N/cm.

The measurement of the adhesive force in the requirement (5) is carried out as follows, for example.

The adhesive sheet is irradiated with ultraviolet light having a wavelength of 365 nm using a high-pressure mercury lamp such that an integrated light amount is 1000 to 5000 mJ/$cm^2$ (for example, 4000 mJ/$cm^2$), a polyester film for backing is attached to one surface of the adhesive sheet after the curing, and the adhesive sheet is cut into strips with a width of 10 mm and a length of 150 mm to obtain a test piece. The above-described test piece is adhered to a polyester film which has been bonded to soda-lime glass in advance, and subjected to an autoclave treatment (60° C., gauge pressure of 0.2 MPa, and 20 minutes) to obtain a measurement sample of adhesive force. With regard to the obtained measurement sample of adhesive force, the film for backing is peeled off from the soda-lime glass under the conditions of a peeling angle of 180° and a peeling speed of 300 mm/min in an environment of 60° C. and 93% RH, and the tensile strength (N/cm) is measured with a load cell to obtain the adhesive force.

In addition, the polyester film may be hydrolyzed in advance by a surface treatment in order to improve the adhesive force. As the surface treatment, for example, treatments which contribute to improving hydrophilicity, such as a corona treatment, a plasma treatment, and a hydrophilic coating treatment of providing a hydrophilic coating layer, are exemplary examples. An apparatus and treatment conditions for the corona treatment or the plasma treatment can be arbitrarily set based on known techniques in the related art.

The surface of the above-described polyester film may be a surface exhibiting hydrophilicity such that a contact angle with respect to distilled water is, for example, 60 degrees or less, preferably 50 degrees or less.

When the adhesive sheet is irradiated with active energy ray having a wavelength of 365 nm with an integrated light amount of 1000 to 5000 mJ/$cm^2$, and then the irradiated adhesive sheet is bonded to the above-described hydrophilic polyester film, an adhesive force to a surface of the above-described hydrophilic polyester film at 60° C., 93% RH, a peeling angle of 180°, and a peeling speed of 300 mm/min is preferably 0.8 N/cm or more, more preferably 1.0 N/cm or more, and still more preferably 1.5 N/cm or more.

The measurement of the adhesive force to the hydrophilic polyester film can be the same as the measurement of the adhesive force in the requirement (5) described above, except that the above-described hydrophilic polyester film is used as the adherend.

As a method for adjusting the adhesive force in the requirement (5), for example, a method of adjusting the formulation or molecular weight of the (meth)acrylic copolymer, or the type or addition amount of the crosslinking agent, a method of adjusting the irradiation amount of active energy ray, and the like can be exemplary examples. However, the method is not limited to these methods.

In the cured product of the adhesive sheet according to the embodiment after being cured by active energy ray (after the fully curing), when the cured product is irradiated with active energy ray having a wavelength of 365 nm with an integrated light amount of 1000 to 5000 mJ/cm$^2$, a storage shear modulus at 60° C. (G' (60° C.)) obtained by a dynamic viscoelasticity measurement in a shear mode at a frequency of 1 Hz is preferably 50 kPa or less, more preferably 40 kPa or less, still more preferably 35 kPa or less, and particularly preferably 30 kPa or less.

Regarding the lower limit value of the storage shear modulus (G' (60° C.)) of the adhesive sheet, from the viewpoint of preventing glue bleeding out and maintaining the shape of the adhesive sheet, it is preferably 1 kPa or more.

The adhesive sheet satisfying such a storage shear modulus (G' (60° C.)) has excellent flexibility in a wide temperature range from low temperature to high temperature, and even when the adhesive sheet is adhered to a sheet member and subjected to a folding operation, interlaminar stress when folded can be reduced, and peeling or breakage of the flexible member can be suppressed.

The measurement of the storage shear modulus at 60° C. (G' (60° C.)) is carried out as follows, for example.

The adhesive sheet is irradiated with ultraviolet light having a wavelength of 365 nm using a high-pressure mercury lamp such that an integrated light amount is 1000 to 5000 mJ/cm$^2$ (for example, 4000 mJ/cm$^2$), and after repeatedly laminating the adhesive sheet after the curing to adjust the thickness thereof to 0.7 to 1.0 mm, a circular-shaped sample having a diameter of 8 mm is punched out. A dynamic viscoelasticity measurement of the obtained sample is performed using a rheometer under the conditions of a measurement jig of 8 mm-diameter parallel plate, a frequency of 1 Hz, a measurement temperature of −50° C. to 150° C., and a temperature rising rate of 5° C./min, and a value of storage shear modulus (G') at 60° C. is read.

As a method for adjusting the storage shear modulus at 60° C. (G' (60° C.)), for example, a method of adjusting the formulation or molecular weight of the (meth)acrylic copolymer, or the type or addition amount of the crosslinking agent, a method of adjusting the irradiation amount of active energy ray, and the like can be exemplary examples. However, the method is not limited to these methods.

In addition, in the cured product of the adhesive sheet according to the embodiment after being cured by active energy ray (after the fully curing), when the thickness is set to 0.7 to 1.0 mm, a restoration rate calculated from the following expression, which is expressed with a strain ($\gamma_{max}$) when a pressure of 2 kPa is applied for 600 seconds at a temperature of 60° C. and a strain ($\gamma_{min}$) after 600 seconds from unloading the stress, is preferably 60% or more.

$$\text{Restoration rate (\%)}=[(\gamma_{max}-\gamma_{min})/\gamma_{max}]\times 100$$

When the adhesive sheet has such a restoration property, even when the adhesive sheet is adhered to a sheet member and subjected to a folding operation, it is possible to obtain an adhesive sheet having excellent flexibility, which does not leave crease marks due to being placed in a bent state.

From such a viewpoint, the restoration rate is preferably 65% or more, more preferably 70% or more, still more preferably 80% or more, and particularly preferably 90% or more. The upper limit of the restoration rate is 100% since the restoration property is preferably higher.

In the adhesive sheet, in order to improve the restoration property, for example, it is preferable to use, as the (meth) acrylic copolymer, a copolymer including an alkyl (meth) acrylate (a) having an alkyl group having 8 or more and 30 or less carbon atoms (hereinafter, also simply referred to as "alkyl (meth)acrylate (a)") and a constituent unit derived from a vinyl monomer (B) other than the alkyl (meth) acrylate (a), in which the constituent unit derived from the vinyl monomer (B) has a constituent unit derived from a vinyl monomer (B2) including a polar group.

In addition to the formulation of the (meth)acrylic copolymer, the restoration property can be adjusted by a method of adjusting the molecular weight of the (meth)acrylic copolymer, or the type or addition amount of the crosslinking agent, a method of adjusting the irradiation amount of active energy ray, and the like.

The adhesive sheet according to the embodiment may have a single-layer configuration of an adhesive layer composed of an adhesive composition containing the (meth) acrylic copolymer, or a multilayer configuration of two or more layers including the adhesive layer. When the adhesive sheet has a multilayer configuration of two or more layers, the adhesive sheet may include a layer other than the adhesive layer composed of an adhesive composition containing the (meth)acrylic copolymer.

When the adhesive sheet according to the embodiment has a multilayer configuration of two or more layers, the proportion of the adhesive layer composed of an adhesive composition containing the (meth)acrylic copolymer to the total thickness of the adhesive sheet is preferably 10% or more and 100% or less, more preferably 14% or more and 70% or less, and still more preferably 20% or more and 50% or less. The above-described lower limit and upper limit of the proportion of the adhesive layer can be arbitrarily combined.

From the viewpoint that handleability is favorable and excellent unevenness followability is easily obtained, the thickness of the adhesive sheet according to the embodiment is preferably 5 μm or more, more preferably 10 m or more, still more preferably 15 μm or more, and particularly preferably 20 μm or more. From the viewpoint that it is easy to relieve stress when folding or bending, and it is easy to make a flexible image display device using the adhesive sheet thinner, the thickness of the adhesive sheet according to the embodiment is preferably 100 μm or less, more preferably 80 μm or less, still more preferably 70 μm or less, and particularly preferably 60 μm or less. The above-described lower limit and upper limit of the thickness of the adhesive sheet can be arbitrarily combined. For example, the thickness of the adhesive sheet is preferably 5 to 100 μm, more preferably 10 to 80 μm, still more preferably 15 to 70 μm, and particularly preferably 20 to 60 μm.

[Adhesive Composition]

The adhesive composition forming the adhesive layer contains a (meth)acrylic copolymer. The (meth)acrylic copolymer contained in the adhesive composition may be one kind or two or more kinds.

The adhesive composition may further contain a component other than the (meth)acrylic copolymer as necessary.

((Meth)Acrylic Copolymer)

In the adhesive sheet according to the embodiment, as one method for adjusting the creep strain in the requirement (1), the falling time in the requirement (2), the G' (−20° C.) in the requirement (3), the G' (−20° C.) in the requirement (4), and the adhesive force in the requirement (5), the formulation of the (meth)acrylic copolymer is adjusted.

Hereinafter, an example of the (meth)acrylic copolymer which can be preferably used in the adhesive sheet satisfying the requirements (1) to (3) and preferably satisfying the requirements (4) and (5) (hereinafter, also referred to as "present copolymer") will be described.

Since the adhesive sheet satisfying the requirements (1) to (3) is easily obtained, the (meth)acrylic copolymer used in the adhesive sheet according to the embodiment is preferably a block copolymer or a graft copolymer. When the (meth)acrylic copolymer is a block copolymer or a graft copolymer, it is easy to obtain an adhesive sheet having excellent shape retention and hot-melt properties. A (meth) acrylic copolymer which is a block copolymer and a (meth) acrylic copolymer which is a graft copolymer may be used in combination.

The "block copolymer" refers to a copolymer which has a plurality of segments composed of constituent units derived from the same type (meth)acrylic monomer, in which chemical structures of the constituent units are different between each segment, and the plurality of segments are bonded in a linear chain. In the (meth)acrylic copolymer which is the block copolymer, some segment is preferably a copolymer having a constituent unit derived from a macromonomer.

The "graft copolymer" refers to a copolymer which has a constituent unit derived from a (meth)acrylic monomer as a backbone component and has a structure of such as a comb-shaped polymer, a brush-shaped polymer, a star polymer, a coconut-shaped polymer, and a dumbbell polymer by introducing a branch component. In the (meth)acrylic copolymer which is the graft copolymer, the branch component is preferably a copolymer having a constituent unit derived from a macromonomer.

It is considered that, in both the block copolymer and the graft copolymer having the constituent unit derived from a macromonomer, the constituent units derived from a macromonomer are aggregated to be phase-separated, and thus the same effect can be obtained.

From the viewpoint of ease of synthesis and adjustment of formulation, it is preferable that the (meth)acrylic copolymer is a block copolymer or a graft copolymer, which has a segment (A) including a constituent unit derived from the alkyl (meth)acrylate (a) having an alkyl group having 8 or more and 30 or less carbon atoms.

The present copolymer has the segment (A) including the constituent unit derived from the alkyl (meth)acrylate (a) having an alkyl group having 8 or more and 30 or less carbon atoms.

When the number of carbon atoms in the alkyl group of the alkyl (meth)acrylate (a) is 8 or more, since a degree of freedom in molecular movement is high, there is a tendency that unevenness followability during bonding (for example, at a high temperature of approximately 70° C.), flexibility during use at a low temperature (for example, −20° C.), and bending resistance are excellent. When the number of carbon atoms in the alkyl group of the alkyl (meth)acrylate (a) is 30 or less, since the alkyl group is less likely to cause crystallization and to be harden, there is a tendency that unevenness followability during bonding (for example, at a high temperature of approximately 70° C.), flexibility during use at a low temperature (for example, −20° C.), and bending resistance are excellent. When the number of carbon atoms in the alkyl group of the alkyl (meth)acrylate (a) is 8 or more and 30 or less, in the adhesive layer to be formed, unevenness followability during bonding (for example, at a high temperature of approximately 70° C.), shape holding power during storage, and flexibility during use at a low temperature (for example, −20° C.) are excellent. The number of carbon atoms in the alkyl group of the alkyl (meth)acrylate (a) is preferably 9 or more and 18 or less, and more preferably 10 or more and 14 or less.

The alkyl group of the alkyl (meth)acrylate (a) may be linear or branched, or may be a mixture of linear and branched.

As specific examples of the alkyl (meth)acrylate (a), for example, octyl (meth)acrylate, isooctyl (meth)acrylate, 2-ethylhexyl (meth)acrylate, nonyl (meth)acrylate, isononyl (meth)acrylate, decyl (meth)acrylate, isodecyl (meth)acrylate, lauryl (meth)acrylate, hexadecyl (meth)acrylate, stearyl (meth)acrylate, isostearyl (meth)acrylate, icosyl (meth)acrylate, behenyl (meth)acrylate, and the like are exemplary examples. One kind or a combination of two or more kinds of the alkyl (meth)acrylates (a) may be used.

From the viewpoint of flexibility at low temperatures, the alkyl (meth)acrylate (a) is preferably an alkyl (meth)acrylate (a1) having an alkyl group having 12 to 30 carbon atoms. The number of carbon atoms in the alkyl group of the alkyl (meth)acrylate (a1) is preferably 12 to 18.

The alkyl (meth)acrylate (a1) may be a mixture of a first alkyl (meth)acrylate having an alkyl group having 12 to 30 carbon atoms and a second alkyl (meth)acrylate having an alkyl group having 12 to 30 carbon atoms, the carbon atoms being different from that in the alkyl group of the first alkyl (meth)acrylate.

The alkyl (meth)acrylate (a1) may be used in combination with an alkyl (meth)acrylate having an alkyl group having 8 to 11 carbon atoms.

From the viewpoint of ease of polymerization control, the alkyl (meth)acrylate (a) is preferably an alkyl methacrylate.

The above-described segment (A) may further have a constituent unit other than the constituent unit derived from the alkyl (meth)acrylate (a).

Various monomers can be used to form other constituent units, and for example, hydroxyl group-containing (meth) acrylates such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, isoamyl (meth)acrylate, hexyl (meth)acrylate, 4-t-butylcyclohexyl (meth)acrylate, phenyl (meth)acrylate, benzyl (meth)acrylate, cyclohexyl (meth)acrylate, tetrahydrofurfuryl (meth)acrylate, isobornyl (meth)acrylate, 3,5,5-trimethylcyclohexyl (meth)acrylate, dicyclopentanyl (meth)acrylate, dicyclopentenyl (meth)acrylate, dicyclopentenyloxyethyl (meth)acrylate, terpene acrylate and a derivative thereof, hydrogenated rosin acrylate and a derivative thereof, docosyl (meth)acrylate, 2-ethylhexyl (meth)acrylate, 2-hydroxyethyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, and glycerol (meth)acrylate; carboxy group-containing vinyl monomers such as (meth)acrylic acid, 2-(meth)acryloyloxyethylhexahydrophthalic acid, 2-(meth)acryloyloxypropylhexahydrophthalic acid, 2-(meth)acryloyloxyethylphthalic acid, 2-(meth)acryloyloxypropylphthalic acid, 2-(meth)acryloyloxyethylmaleic acid, 2-(meth)acryloyloxypropylmaleic acid, 2-(meth)acryloyloxyethylsuccinic acid, 2-(meth)acryloyloxypropylsuccinic acid, crotonic acid, fumaric acid, maleic acid, itaconic acid, monomethyl maleate, and monomethyl itaconate; acid anhydride group-containing vinyl monomers such as maleic acid anhydride and itaconic acid anhydride; epoxy group-containing vinyl monomers such as glycidyl (meth)acrylate, α-ethyl glycidyl acrylate, and 3,4-epoxybutyl (meth)acrylate; amino group-containing (meth)acrylic acid ester-based vinyl monomers such as dimethylaminoethyl (meth)acrylate and diethylaminoethyl (meth)acrylate; amide group-containing vinyl monomers such as (meth)acrylamide, N-t-butyl (meth)acrylamide, N-methylol (meth)acrylamide, N-isopropyl acrylamide, hydroxyethyl acrylamide, N-methoxymethyl (meth)acrylamide, N-butoxymethyl (meth)acrylamide, diacetone acrylamide, maleic acid amide, and maleimide; vinyl monomers such as styrene, α-methylstyrene, vinyltoluene, (meth)acrylonitrile, vinyl chloride, vinyl acetate, and vinyl propionate; polyfunctional vinyl monomers such as divinylbenzene, ethylene glycol di(meth)acrylate, 1,3-butylene glycol di(meth)acrylate, 1,6-hexanediol di(meth)acrylate, triethylene glycol di(meth)acrylate, tetraethylene glycol di(meth)acrylate, tripropylene glycol di(meth)acrylate, trimethylolpropane tri(meth)acrylate, allyl(meth)acrylate, and N,N'-methylenebis(meth)acrylamide; acryloyl morpholine, polyethylene glycol (meth)acrylate, polypropylene glycol (meth)acrylate, methoxyethyl (meth)acrylate, ethoxyethyl (meth)acrylate, n-butoxyethyl (meth)acrylate, isobutoxyethyl (meth)acrylate, t-butoxyethyl (meth)acrylate, ethoxyethoxyethyl (meth)acrylate, phenoxyethyl (meth)acrylate, nonylphenoxyethyl (meth)acrylate, 3-methoxybutyl (meth)acrylate, acetoxyethyl (meth)acrylate, "Placcel FM" (trade name, manufactured by DAICEL CORPORATION, caprolactone-added monomer), "BLEMMER PME-100" (trade name, manufactured by NOF CORPORATION, methoxypolyethylene glycol methacrylate (one having two ethylene glycol chains)), "BLENMER PME-200" (trade name, manufactured by NOF CORPORATION, methoxypolyethylene glycol methacrylate (one having four ethylene glycol chains)), "BLENMER PME-400" (trade name, manufactured by NOF CORPORATION, methoxypolyethylene glycol methacrylate (one having nine ethylene glycol chains)), "BLENMER 50POEP-800B" (trade name, manufactured by NOF CORPORATION, octoxypolyethylene glycol-polypropylene glycol-methacrylate (one having eight ethylene glycol chains and six propylene glycol chains), and "BLENMER 20ANEP-600" (trade name, manufactured by NOF CORPORATION, nonylphenoxy(ethylene glycol-polypropylene glycol) monoacrylate), "BLENMER AME-100" (trade name, manufactured by NOF CORPORATION), "BLENMER AME-200" (trade name, manufactured by NOF CORPORATION), and "BLENMER 50AOEP-800B" (trade name, manufactured by NOF CORPORATION), VISCOAT #150 (manufactured by OSAKA ORGANIC CHEMICAL INDUSTRY LTD., trade name), VISCOAT #190 (manufactured by OSAKA ORGANIC CHEMICAL INDUSTRY LTD., trade name), VISCOAT #230 (manufactured by OSAKA ORGANIC CHEMICAL INDUSTRY LTD., trade name), 2-methachloroyloxyethyl acid phosphate; silicone-based monomers such as Silaplane FM-0711 (trade name, manufactured by JNC Corporation), Silaplane FM-0721 (trade name, manufactured by JNC Corporation), Silaplane FM-0725 (trade name, manufactured by JNC Corporation), Silaplane TM-0701 (trade name, manufactured by JNC Corporation), Silaplane TM-0701T (trade name, manufactured by JNC Corporation), X-22-174DX (trade name, manufactured by Shin-Etsu Chemical Co., Ltd.), X-22-2426 (trade name, manufactured by Shin-Etsu Chemical Co., Ltd.), X-22-2475 (trade name, manufactured by Shin-Etsu Chemical Co., Ltd.), and 3-(meth)acryloxypropylmethyldimethoxysilane; silane coupling agent-containing monomers such as 3-(meth)acryloxypropyltrimethoxysilane, 3-(meth)acryloxypropylmethyldiethoxysilane, 3-(meth)acryloxypropyltriethoxysilane, 3-acryloxypropyltrimethoxysilane, vinyltrimethoxysilane, and vinyltriethoxysilane; fluorine-containing monomers such as 2,2,2-trifluoroethyl (meth)acrylate, 2,2,3,3,3-pentafluorophenyl (meth)acrylate, 2-(perfluorobutyl)ethyl (meth)acrylate, 3-(perfluorobutyl)-2-hydroxypropyl (meth)acrylate, 2-(perfluorohexyl)ethyl (meth)acrylate, 3-perfluorohexyl-2-hydroxypropyl (meth)acrylate, 3-(perfluoro-3-methylbutyl)-2-hydroxypropyl (meth)acrylate, 2,2,3,3-tetrafluoropropyl (meth)acrylate, 1H,1H,5H-octafluoropentyl (meth)acrylate, 1H,1H,5H-octafluoropentyl (meth)acrylate, 1H,1H,2H,2H-tridecafluorooctyl (meth)acrylate, 1H-1-(trifluoromethyl)trifluoroethyl (meth)acrylate, 1H,1H,3H-hexafluorobutyl (meth)acrylate, and 1,2,2,2-tetrafluoro-1-(trifluoromethyl)ethyl (meth)acrylate; monomers having an acetal structure, such as 1-butoxyethyl (meth)acrylate, 1-(2-ethylhexyloxy)ethyl (meth)acrylate, 1-(cyclohexyloxy)ethyl (meth)acrylate, and 2-tetrahydropyranyl (meth)acrylate; 4-(meth)acryloyloxybenzophenone, and 2-isocyanatoethyl (meth)acrylate are exemplary examples.

Typically, the segment (A) has two or more constituent units represented by Formula (a') (hereinafter, also referred to as "constituent unit (a')), and at least a part of the two or more constituent units (a') is the constituent unit derived from the alkyl (meth)acrylate (a).

P's of the two or more constituent units (a') may be the same or different from each other. Q's of the two or more constituent units (a') may be the same or different from each other.

The above-described segment (A) may further have a constituent unit other than the constituent unit (a').

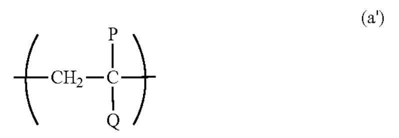

(a')

In Formula (a'), P represents a hydrogen atom, a methyl group, or $CH_2OH$. Q is selected from the group consisting of OR, $O_2CR$, halogen, $CO_2H$, COR, $CO_2R$, CN, $CONH_2$, CONHR, $CONR_2$, $COOCH(CH_3)OR$, and R'. R is selected from the group consisting of a hydroxy atom, a substituted or unsubstituted alkyl group, a substituted or unsubstituted cycloalkyl group, a substituted or unsubstituted aryl group, a substituted or unsubstituted heterocyclic group, a substituted or unsubstituted aralkyl group, a substituted or unsubstituted alkaryl group, and a substituted or unsubstituted organosilyl group, in which substituents are the same or different from each other, and are selected from the group consisting of a carboxylic acid group, a carboxylic acid ester group, an epoxy group, a hydroxy group, an alkoxy group, a primary amino group, a secondary amino group, a tertiary amino group, an isocyanato group, a sulfonic acid group, and a halogen atom. R' is selected from aromatic groups consisting of a substituted or unsubstituted aryl group and a substituted or unsubstituted heteroaryl group, in which substituents are the same or different from each other, and are selected from the group consisting of a carboxylic acid group, a carboxylic acid ester group, an epoxy group, a hydroxy group, an alkoxy group, a primary amino group, a secondary amino group, a tertiary amino group, an isocyanato group, a sulfonic acid group, a substituted or unsubstituted alkyl group, a substituted or unsubstituted aryl group, a substituted or unsubstituted olefin group, and a halogen atom.

The constituent unit derived from the alkyl (meth)acrylate (a) is a constituent unit in which, in Formula (a'), P is a hydrogen atom or a methyl group, Q is $CO_2R$, and R is an alkyl group having 8 to 30 carbon atoms.

As a monomer forming the constituent unit (a') other than the alkyl (meth)acrylate (a) and a monomer forming other constituent units, the same monomers as described above are exemplary examples.

The proportion of the constituent unit derived from the alkyl (meth)acrylate (a) to 100% by mass of all constituent units constituting the segment (A) is preferably 70% by mass or more, more preferably 80% by mass or more, still more preferably 90% by mass or more, and may be 100% by mass.

It is preferable that the segment (A) has a constituent unit derived from methacrylate as the constituent unit.

From the viewpoint of shape holding power when not bonded, the proportion of the constituent unit derived from methacrylate to 100% by mass of all constituent units constituting the above-described segment (A) is preferably 50% by mass or more, more preferably 70% by mass or more, still more preferably 90% by mass or more, and may be 100% by mass.

From the viewpoint of productivity, the proportion of a constituent unit derived from the carboxy group-containing vinyl monomer to 100% by mass of all constituent units constituting the segment (A) is preferably 0% to 10% by mass.

The proportion of the above-described constituent unit derived from the segment (A) to 100% by mass of all constituent units constituting the present copolymer is preferably 1% by mass or more and 30% by mass or less, more preferably 3% by mass or more and 20% by mass or less, and still more preferably 5% by mass or more and 15% by mass or less. When the proportion of the constituent unit derived from the segment (A) is the above-described lower limit value or more, force of phase separation is strong and the shape holding power of the adhesive sheet when not bonded tends to be more excellent, and when the proportion is the above-described upper limit value or less, the phase-separated structure tends to collapse during bonding and the unevenness followability tends to be more excellent. The above-described lower limit and upper limit of the proportion of the constituent unit derived from the segment (A) can be arbitrarily combined.

The present copolymer preferably has a constituent unit derived from a macromonomer (A1) and a constituent unit derived from a vinyl monomer (B), which will be described later.

In addition, the present copolymer is preferably a block copolymer or a graft copolymer, which has the above-described segment (A) and a segment having the constituent unit derived from a vinyl monomer (B), which will be described later.

The above-described copolymer includes a block copolymer in which both the segment (A) and the segment having the constituent unit derived from the vinyl monomer (B) constitute a main chain, or a graft copolymer in which the above-described segment (A) or the segment having the constituent unit derived from the vinyl monomer (B) constitutes a main chain, and the other segment constitutes a side chain.

Among these, it is still more preferable that the above-described (meth)acrylic copolymer has a segment having the constituent unit derived from a macromonomer (A1), and the macromonomer (A1) is a block copolymer or a graft copolymer, which has the above-described constituent unit derived from the alkyl (meth)acrylate (a) (hereinafter, also referred to as "copolymer (I)").

Typically, the macromonomer (A1) has a radically polymerizable group or an addition-reactive functional group such as a hydroxy group, an isocyanate group, an epoxy group, a carboxy group, an amino group, an amide group, and a thiol group. Only one or both of the radically polymerizable group and the functional group may be included. When both the radically polymerizable group and the functional group are included, each of the radically polymerizable group and the functional group may be two or more kinds thereof.

Among the above, in particular, from the viewpoint of being copolymerizable with the vinyl monomer (B), a macromonomer having a radically polymerizable group is preferable. The radically polymerizable group in the macromonomer (A1) may be two or more, but is preferably one. When the macromonomer (A1) has a functional group, the functional group may be two or more, but is preferably one.

The macromonomer (A1) preferably has a constituent unit derived from an alkyl (meth)acrylate having a linear or branched alkyl group having 8 or more carbon atoms, and more preferably has a constituent unit derived from the alkyl (meth)acrylate (a).

The macromonomer (A1) preferably has a radically polymerizable group at a terminal of a main chain including two or more of the constituent units (a') described in detail in the segment (A) above, and more preferably has a terminal structure represented by Formula (1). "• • •" in Formula (1) represents a main chain portion including two or more of the constituent units (a').

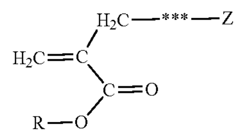

(1)

In Formula (1), R can be the same as R described above.

For example, R may be a linear or branched alkyl group having 1 to 20 carbon atoms. As specific examples thereof, a methyl group, an ethyl group, an n-propyl group, an i-propyl group, an n-butyl group, a t-butyl group, an i-butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group are exemplary examples. Among these, from the viewpoint of availability, a methyl group, an ethyl group, an n-propyl group, an i-propyl group, an n-butyl group, a t-butyl group, a pentyl group, a hexyl group, a heptyl group, or an octyl group is preferable, and a methyl group, an ethyl group, an n-propyl group, an i-propyl group, an n-butyl group, or a t-butyl group is more preferable.

For example, R may be a cycloalkyl group having 3 to 20 carbon atoms. As specific examples thereof, a cyclopropyl group, a cyclobutyl group, a cyclopentyl group, a cyclohexyl group, a cycloheptyl group, a cyclooctyl group, and an adamantyl group are exemplary examples. From the viewpoint of availability, a cyclopropyl group, a cyclobutyl group, or an adamantyl group is preferable.

For example, R may be an aryl group having 6 to 18 carbon atoms. As specific examples thereof, a phenyl group, a naphthyl group, a benzophenone structure, and the like are exemplary examples.

For example, R may be a heterocyclic group having 5 to 18 carbon atoms. As specific examples of the heterocyclic group, heteroaryl groups such as a pyridyl group, a γ-butyrolactone group, and an ε-caprolactone group are exemplary examples.

As a substituent which may be included in R, a group or an atom selected from the group consisting of an alkyl group, an aryl group, a carboxy group, an alkoxycarbonyl group (—COOR"), a cyano group, a hydroxy group, an amino group (—NR"R'"), an amide group (—CONR"R'"), a halogen atom, an allyl group, an epoxy group, an alkoxy group (—OR"), a siloxy group, and a group exhibiting hydrophilicity or ionicity is an exemplary example. R" and R'" each independently have the same definition as that for R.

As the alkoxycarbonyl group of the above-described substituent, for example, a methoxycarbonyl group is an exemplary example.

As the amino group of the above-described substituent, an amino group, a monomethylamino group, and a dimethylamino group are exemplary examples.

As the amide group of the above-described substituent, for example, a carbamoyl group (—$CHNH_2$), an N-methylcarbamoyl group (—CONHMe), and an N,N-dimethylcarbamoyl group (dimethylamide group; —$CONMe_2$) are exemplary examples. Me represents a methyl group.

As the halogen atom of the above-described substituent, for example, a fluorine atom, a chlorine atom, a bromine atom, and an iodine atom are exemplary examples.

As the alkoxy group of the above-described substituent, for example, an alkoxy group having 1 to 12 carbon atoms is an exemplary example, and as specific examples thereof, a methoxy group is an exemplary example.

As the group exhibiting hydrophilicity or ionicity of the above-described substituent, for example, cationic substituents such as an alkali salt of a carboxy group, an alkali salt of a sulfoxyl group, a poly(alkylene oxide) group such as polyethylene oxide group or a polypropylene oxide group, and a quaternary ammonium base are exemplary examples.

Z represents a terminal group of the macromonomer (A1). As the terminal group of the macromonomer (A1), for example, a hydrogen atom and a group derived from a radical polymerization initiator, similarly to a terminal group of a polymer obtained by known radical polymerization, are exemplary examples.

As the macromonomer (A1), a macromonomer in which the proportion of the constituent unit derived from the (meth)acrylic monomer to 100% by mass of all constituent units constituting the macromonomer (A1) is 80% by mass or more is preferable, and a macromonomer having a structure of Formula (2) is particularly preferable. At least a part of the constituent unit derived from the (meth)acrylic monomer is the constituent unit derived from the alkyl (meth)acrylate (a).

(2)

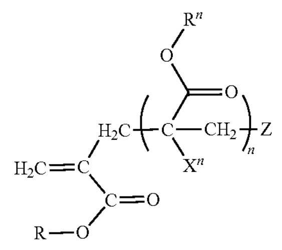

In Formula (2), n is a natural number of 2 to 100,000. R and R″ each independently can be the same as R described above. n pieces of R″'s may be the same or different from each other. X″ can be the same as P in Formula (a') described above. n pieces of X″'s may be the same or different from each other. Z is a terminal group.

Z has the same definition as the terminal group of Z in Formula (1).

The proportion of the constituent unit derived from the alkyl (meth)acrylate (a) to 100% by mass of all constituent units constituting the macromonomer (A1) is preferably 70% by mass or more, more preferably 80% by mass or more, still more preferably 90% by mass or more, and may be 100% by mass.

The proportion of the constituent unit derived from the alkyl (meth)acrylate (a1) to 100% by mass of all constituent units constituting the macromonomer (A1) is preferably 40% by mass or more, more preferably 60% by mass or more, still more preferably 80% by mass or more, and may be 100% by mass.

The macromonomer (A1) preferably has a constituent unit derived from methacrylate as the constituent unit constituting the macromonomer (A1).

The proportion of the constituent unit derived from methacrylate to 100% by mass of all constituent units constituting the macromonomer (A1) is preferably 50% to 100% by mass, more preferably 70% to 100% by mass, and still more preferably 90% to 100% by mass. When the proportion of the constituent unit derived from methacrylate is 50% by mass or more, the molecular weight of the macromonomer (A1) can be lowered.

From the viewpoint of productivity, the proportion of a constituent unit derived from the carboxy group-containing monomer to 100% by mass of all constituent units constituting the macromonomer (A1) is preferably 0% to 10% by mass.

The number-average molecular weight (Mn) of the macromonomer (A1) is preferably 1,000 or more and 30,000 or less, more preferably 2,000 or more and 20,000 or less, and still more preferably 3,000 or more and 10,000 or less. When the number-average molecular weight of the macromonomer (A1) is the above-described lower limit value or more, entanglement between molecules is increased, and the holding power tends to be improved. When the number-average molecular weight of the macromonomer (A1) is the above-described upper limit value or less, the unevenness followability tends to be improved. The above-described lower limit and upper limit of the number-average molecular weight of the macromonomer (A1) can be arbitrarily combined.

The weight-average molecular weight (Mw) of the macromonomer (A1) is preferably 2,000 or more and 60,000 or less, more preferably 4,000 or more and 40,000 or less, and still more preferably 6,000 or more and 20,000 or less. When the weight-average molecular weight of the macromonomer (A1) is the above-described lower limit value or more, entanglement between molecules is increased, and the holding power tends to be improved. When the weight-average molecular weight of the macromonomer (A1) is the above-described upper limit value or less, the unevenness followability tends to be improved. The above-described lower limit and upper limit of the weight-average molecular weight of the macromonomer (A1) can be arbitrarily combined.

The number-average molecular weight and the weight-average molecular weight of the macromonomer (A1) are values in terms of standard polystyrene, which are measured by gel permeation chromatography (GPC).

The glass transition temperature (hereinafter, also referred to as "$Tg_A$") of the macromonomer (A1) is preferably lower than 0° C., more preferably −20° C. or lower, and still more preferably −50° C. or lower. The lower limit of $Tg_A$ is not particularly limited, but for example, is −100° C. When $Tg_A$ is the above-described upper limit value or less, flexibility at low temperatures tends to be improved.

When the monomer forming the macromonomer (A1) is one kind, $Tg_A$ is a glass transition temperature of a homopolymer of the monomer, and when the monomer forming the macromonomer (A1) is a plurality of kinds, $Tg_A$ is a value calculated by Fox equation.

For example, when the macromonomer (A1) consists of a constituent unit derived from a monomer p, a constituent unit derived from a monomer q, and a constituent unit derived from a monomer r, the glass transition temperature (unit: ° C.) of the macromonomer (A1) is obtained by calculating Tg by the following Fox equation from a glass transition temperature of each homopolymer of the monomer p, the monomer q, and the monomer r and a mass fraction thereof.

$$1/(273+Tg)=\Sigma\big(Wi/(273+Tgi)\big)$$

(in the expression, Wi represents a mass fraction of a monomer i, and Tgi represents a glass transition temperature (° C.) of a homopolymer of the monomer i)

As the glass transition temperature of the homopolymer of the monomer i, a literature value, for example, a value in Polymer Handbook [Polymer HandBook, J. Brandrup, Interscience, 1989] or a value described in a catalog of the monomer can be used.

As the macromonomer (A1), a macromonomer produced by a known method may be used, or a commercially available macromonomer may be used.

As a method for producing the macromonomer (A1) having a radically polymerizable group, for example, a method of producing the macromonomer using a cobalt chain transfer agent, a method of using an α-substituted unsaturated compound such as an α-methylstyrene dimer as a chain transfer agent, a method of chemically bonding a radically polymerizable group to a polymer, and a method of performing thermal decomposition are exemplary examples.

Among these, as the method for producing the macromonomer (A1), from the viewpoint of using a catalyst in which the number of production steps is small and a chain transfer constant is large, a method of producing the macromonomer using a cobalt chain transfer agent is preferable. A structure of the macromonomer (A1) when being produced using a cobalt chain transfer agent corresponds to Formula (1) described above.

As a method for producing the macromonomer (A1) having a functional group which can be added to a polymer including the vinyl monomer (B), for example, a method of copolymerizing vinyl monomers having the functional group, a method of introducing the functional group using a chain transfer agent such as thioglycol or thioglycolic acid, and a method of introducing the functional group using an initiator are exemplary examples.

As a polymerization method when producing the macromonomer (A1), for example, a block polymerization method, a solution polymerization method, and an aqueous dispersion polymerization method such as a suspension polymerization method and an emulsion polymerization method are exemplary examples, and a solution polymerization is preferable.

As a method of chemically bonding the radically polymerizable group to a polymer, for example, a production method in which a halogen group of a polymer having a halogen group is substituted with a compound having a radically polymerizable carbon-carbon bond; a method of reacting a vinyl monomer having an acid group with a vinyl-based polymer having an epoxy group; a method of reacting a vinyl-based polymer having an epoxy group with a vinyl monomer having an acid group; and a method in which a vinyl-based polymer having a hydroxyl group is reacted with a diisocyanate compound to obtain a vinyl-based polymer having an isocyanate group, and the vinyl-based polymer is reacted with a vinyl monomer having a hydroxyl group are exemplary examples. The macromonomer (A1) may be produced by any method.

(Constituent Unit Derived from Vinyl Monomer (B))

As the vinyl monomer (B), the same monomer as the monomer for obtaining the macromonomer (A1) can be used. One kind or a combination of two or more kinds of the vinyl monomers (B) may be used. The vinyl monomer (B) may be a (meth)acrylic monomer or a monomer other than the (meth)acrylic monomer, or may be used in combination of these.

The constituent unit derived from the vinyl monomer (B) preferably includes a constituent unit derived from an alkyl (meth)acrylate having a linear or branched alkyl group having 6 or more carbon atoms, and more preferably includes a constituent unit derived from an alkyl (meth) acrylate (B1) having an alkyl group having 6 or more and 30 or less carbon atoms (hereinafter, also simply referred to as "alkyl (meth)acrylate (B1)"). In addition, it is more preferable that the constituent unit derived from the vinyl monomer (B) further includes a constituent unit derived from a vinyl monomer (B2) having a polar group (hereinafter, also simply referred to as "vinyl monomer (B2)").

The alkyl (meth)acrylate (B1) has an alkyl group having 6 or more and 30 or less carbon atoms.

When the number of carbon atoms in the alkyl group of the alkyl (meth)acrylate (B1) is 6 or more, there is a tendency that the unevenness followability during bonding (for example, at a high temperature of approximately 70° C.), the flexibility during use at a low temperature (for example, −20° C.), and the bending resistance are more excellent. The number of carbon atoms in the alkyl group of the alkyl (meth)acrylate (B1) is more preferably 8 or more. When the number of carbon atoms in the alkyl group of the alkyl (meth)acrylate (B1) is 30 or less, there is a tendency that the shape retention or adhesiveness when not bonded is more excellent. The number of carbon atoms in the alkyl group of the alkyl (meth)acrylate (B1) is more preferably 20 or less, still more preferably 15 or less, even more preferably 14 or less, and particularly preferably 10 or less.

The alkyl group of the alkyl (meth)acrylate (B1) may be linear or branched.

As specific examples of the alkyl (meth)acrylate (B1), hexyl (meth)acrylate, heptyl (meth)acrylate, octyl (meth) acrylate, isooctyl (meth)acrylate, 2-ethylhexyl (meth)acrylate, nonyl (meth)acrylate, isononyl (meth)acrylate, decyl (meth)acrylate, isodecyl (meth)acrylate, lauryl (meth)acrylate, hexadecyl (meth)acrylate, stearyl (meth)acrylate, isostearyl (meth)acrylate, icosyl (meth)acrylate, behenyl (meth)acrylate, and the like are exemplary examples. One kind or a combination of two or more kinds of the alkyl (meth)acrylates (B1) may be used.

From the viewpoint that the present copolymer with a high polymerization rate and a high molecular weight is easily obtained, the alkyl (meth)acrylate (B1) is preferably an alkyl acrylate.

The vinyl monomer (B2) has a polar group. When including the constituent unit derived from the vinyl monomer (B2), polarity of a polymer component of the vinyl monomer (B) is enhanced, and the copolymer (I) is likely to cause phase separation. In addition, the adhesiveness is also excellent.

As the polar group, for example, at least one selected from the group consisting of a hydroxyl group, a polyalkylene glycol group, a carboxy group, an amide group, and an amino group is an exemplary example. The number of carbon atoms in an alkylene group of the polyalkylene glycol group is preferably 2 to 4 and particularly preferably 2. As the polar group, from the viewpoint of corrosion resistance of the adhesive sheet against metal or the like, a hydroxyl group, a polyalkylene glycol group, an amide group, or an amino group is preferable.

When the hydrophilicity of the surface of the adherend to be bonded is high and the contact angle of the surface of the adherend with respect to distilled water is, for example, 60 degrees or less, as the polar group, from the viewpoint of adhesive force, a hydroxyl group is preferable.

The polar group may be directly bonded to a carbon atom constituting an ethylenically unsaturated bond of the vinyl monomer (B2), or may be bonded through a linking group. As the linking group, for example, $—C(=O)—O—C_qH_{2q}—$ and $—O—C_qH_{2q}—$ are exemplary examples. q is an integer of 1 to 12, preferably an integer of 2 to 6.

When the length of a side group of the constituent unit derived from the vinyl monomer (B2) is long, the flexibility during use at low temperatures (for example, −20° C.) tends to be more excellent. Therefore, when the polar group is a group other than the polyalkylene glycol group, (for example, a hydroxyl group or a carboxy group), the polar group is preferably bonded through the linking group.

The vinyl monomer (B2) may be a (meth)acrylic monomer or a monomer other than the (meth)acrylic monomer, or may be used in combination of these.

As specific examples of the vinyl monomer (B2), hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth) acrylate, glycerin mono(meth)acrylate, polyethylene glycol mono(meth)acrylate, polypropylene glycol mono(meth) acrylate, polyethylene glycol polypropylene glycol mono (meth)acrylate, polyethylene glycol polybutylene glycol mono(meth)acrylate, polypropylene glycol polybutylene glycol mono(meth)acrylate, and hydroxyphenyl(meth)acrylate; (meth)acrylic acid; carboxy group-containing monomers such as carboxyethyl (meth)acrylate, carboxypropyl (meth)acrylate, carboxybutyl (meth)acrylate, ω-carboxy-polycaprolactone mono(meth)acrylate, 2-(meth)acryloyloxyethylhexahydrophthalic acid, 2-(meth)acryloyloxypropylhexahydrophthalic acid, 2-(meth) acryloyloxyethylphthalic acid, 2-(meth) acryloyloxypropylphthalic acid, 2-(meth) acryloyloxyethylmaleic acid, 2-(meth) acryloyloxypropylmaleic acid, 2-(meth) acryloyloxyethylsuccinic acid, 2-(meth) acryloyloxypropylsuccinic acid, crotonic acid, fumaric acid, maleic acid, and itaconic acid; aminoalkyl (meth)acrylates such as aminomethyl (meth)acrylate, aminoethyl (meth) acrylate, aminopropyl (meth)acrylate, and aminoisopropyl (meth)acrylate; amino group-containing monomers such as N-alkylaminoalkyl (meth)acrylates and N,N-dialkylaminoalkyl (meth)acrylates, for example, N,N-dimethylaminoethyl (meth)acrylate and N,N-dimethylaminopropyl (meth) acrylate; and amide group-containing monomers such as (meth)acrylamide, N,N-dimethyl(meth)acrylamide, N-butyl (meth)acrylamide, N-methylol(meth)acrylamide, N-methylolpropane(meth)acrylamide, N-methoxymethyl(meth)acrylamide, N-butoxymethyl(meth)acrylamide, diacetone (meth) acrylamide, and maleic acid amide are exemplary examples. One kind or a combination of two or more kinds of the vinyl monomers (B2) may be used. The vinyl monomer (B2) may be a (meth)acrylic monomer or a monomer other than the (meth)acrylic monomer, or may be used in combination of these.

As the vinyl monomer (B2), from the viewpoint of adhesive force when the surface of the adherend is highly hydrophilic and of flexibility at low temperatures, a hydroxyalkyl (meth)acrylate is preferable, a hydroxyalkyl (meth)acrylate in which the number of carbon atoms in the hydroxyalkyl group is 2 to 6 is more preferable, and 4-hydroxybutyl (meth)acrylate is particularly preferable.

From the viewpoint that the present copolymer with a high polymerization rate and a high molecular weight is easily obtained, the hydroxyalkyl (meth)acrylate is preferably a hydroxyalkyl acrylate.

The constituent unit derived from the vinyl monomer (B) may further include a constituent unit derived from a vinyl monomer (B3) other than the alkyl (meth)acrylate (B1) and the vinyl monomer (B2).

As the vinyl monomer (B3), the same monomer as the monomer for obtaining the segment (A) can be used (however, the alkyl (meth)acrylate (B1) and the vinyl monomer (B2) are excluded). One kind or a combination of two or more kinds of the vinyl monomers (B3) may be used. The vinyl monomer (B3) may be a (meth)acrylic monomer, a monomer other than the (meth)acrylic monomer, or a combination thereof.

As the vinyl monomer (B3), an alkyl (meth)acrylate (B3-1) having an alkyl group having 1 to 4 carbon atoms is preferable. When the constituent unit derived from the vinyl monomer (B) includes a constituent unit derived from the alkyl (meth)acrylate (B3-1), the present copolymer is likely to be phase-separated and excellent holding power is likely to be exhibited. In addition, the adhesiveness is also excellent.

From the viewpoint of adhesiveness and flexibility during use at a low temperature (for example, −20° C.), the number of carbon atoms in the alkyl group of the alkyl (meth) acrylate (B3-1) is preferably 2 to 4. The alkyl group may be linear or branched.

As specific examples of the alkyl (meth)acrylate (B3-1), methyl (meth)acrylate, ethyl (meth)acrylate, n-propyl (meth)acrylate, isopropyl (meth)acrylate, n-butyl (meth) acrylate, isobutyl (meth)acrylate, and t-butyl (meth)acrylate are exemplary examples. One kind or a combination of two or more kinds of the alkyl (meth)acrylates (B3-1) may be used.

From the viewpoint that the present copolymer with a high polymerization rate and a high molecular weight is easily obtained, the alkyl (meth)acrylate (B3-1) is preferably an alkyl acrylate.

The alkyl (meth)acrylate (B3-1) may be used in combination with other vinyl monomers (B3).

The other vinyl monomers (B3) can be appropriately selected from the above-described monomers for obtaining the segment (A). For example, isobornyl (meth)acrylate, cyclohexyl (meth)acrylate, styrene, or the like is preferable.

When the macromonomer (A1) is added to a polymer including the vinyl monomer (B), it is suitable that the vinyl monomer (B) includes a monomer having a functional group which can react with the functional group of the macromonomer (A1).

The copolymer (I) has a segment having the constituent unit derived from the macromonomer (A1) and a segment having the constituent unit derived from the vinyl monomer (B). The copolymer (I) can include at least one selected from the group consisting of a polymer having only the constituent unit derived from the macromonomer (A1), a polymer having one or two or more kinds of the constituent unit derived from the vinyl monomer (B), an unreacted macromonomer (A1), and an unreacted vinyl monomer (B).

The proportion of the constituent unit derived from the macromonomer (A1) to 100% by mass of all constituent units constituting the copolymer (I) is preferably 1% by mass or more and 30% by mass or less, more preferably 3% by mass or more and 30% by mass or less, still more preferably 3% by mass or more and 25% by mass or less, even more preferably 3% by mass or more and 20% by mass or less, even still more preferably 4% by mass or more and 18% by mass or less, further more preferably 5% by mass or more and 15% by mass or less, even further more preferably 6% by mass or more and 12% by mass or less, and particularly preferably 10% by mass or more and 15% by mass or less. When the proportion of the constituent unit derived from the macromonomer (A1) is the above-described lower limit value or more, force of phase separation is strong and the shape holding power of the adhesive sheet when not bonded tends to be more excellent, and when the proportion is the above-described upper limit value or less, the flexibility of the adhesive sheet in a low-temperature environment tends to be more excellent. In addition, the phase-separated structure is less likely to collapse at normal temperature, and the shape holding power when not bonded tends to be more excellent. The above-described lower limit and upper limit of the proportion of the constituent unit derived from the macromonomer (A1) can be arbitrarily combined.

The proportion of the constituent unit derived from the vinyl monomer (B) to 100% by mass of all constituent units constituting the copolymer (I) is preferably 70% by mass or more and 99% by mass or less, more preferably 70% by mass or more and 97% by mass or less, still more preferably 75% by mass or more and 97% by mass or less, even more preferably 80% by mass or more and 97% by mass or less, even still more preferably 85% by mass or more and 95% by mass or less, and particularly preferably 85% by mass or more and 90% by mass or less.

The proportion of the constituent unit derived from the alkyl (meth)acrylate (B1) to 100% by mass of all constituent units constituting the present copolymer is preferably 10% by mass or more and 90% by mass or less, more preferably 15% by mass or more and 60% by mass or less, and still more preferably 20% by mass or more and 40% by mass or less. When the proportion of the constituent unit derived from the alkyl (meth)acrylate (B1) is the above-described lower limit value or more, the flexibility during use at the low temperatures and the bending resistance tend to be more excellent, and when the proportion is the above-described upper limit value or less, the phase-separated structure is less likely to collapse at normal temperature and the shape holding power when not bonded tends to be more excellent. The above-described lower limit and upper limit of the proportion of the constituent unit derived from alkyl (meth) acrylate (B1) can be arbitrarily combined.

The proportion of the constituent unit derived from the vinyl monomer (B2) to 100% by mass of all constituent units constituting the present copolymer is preferably 1% by mass or more and 80% by mass or less, more preferably 1% by mass or more and 15% by mass or less, and still more preferably 2% by mass or more and 10% by mass or less. When the proportion of the constituent unit derived from the vinyl monomer (B2) is the above-described lower limit value or more, force of phase separation is strong, the shape holding power when not bonded tends to be more excellent, and the adhesive force tends to be more excellent. When the proportion of the constituent unit derived from the vinyl monomer (B2) is the above-described upper limit value or less, the phase-separated structure tends to collapse during bonding and the unevenness followability tends to be more excellent. The above-described lower limit and upper limit of the proportion of the constituent unit derived from the vinyl monomer (B2) can be arbitrarily combined.

The proportion of the constituent unit derived from the alkyl (meth)acrylate (B3-1) to 100% by mass of all constituent units derived from the vinyl monomer (B) is preferably 50% by mass or more, more preferably 60% by mass or more, still more preferably 80% by mass or more, and may be 100% by mass.

The weight-average molecular weight (Mw) of the present copolymer is preferably 50,000 or more and 2,000,000 or less, more preferably 100,000 or more and 1,500,000 or less, and still more preferably 300,000 or more and 1,000,000. When the weight-average molecular weight of the present copolymer is the above-described lower limit value or more, the durability of the adhesive sheet after bonding tends to be improved. When the weight-average molecular weight of the present copolymer is the above-described upper limit value or less, moldability during adhesive sheet production tends to be improved. In addition, coating property of the adhesive composition tends to be improved. The above-described lower limit and upper limit of the weight-average molecular weight of the present copolymer can be arbitrarily combined.

The number-average molecular weight (Mn) of the present copolymer is preferably 30,000 to 300,000, more preferably 40,000 to 200,000, and still more preferably 40,000 to 100,000. When the number-average molecular weight of the present copolymer is the above-described lower limit value or more, the durability of the adhesive layer tends to be improved. When the number-average molecular weight of the present copolymer is the above-described upper limit value or less, the coating property of the adhesive composition tends to be improved.

The weight-average molecular weight and the number-average molecular weight of the present copolymer are values in terms of standard polystyrene, which are measured by gel permeation chromatography (GPC).

A melt viscosity of the present copolymer at 130° C. is preferably 20 Pa·s or more and 800 Pa·s or less, more preferably 20 Pa·s or more and 600 Pa·s or less, still more preferably 50 Pa·s or more and 600 Pa·s or less, and particularly preferably 100 Pa·s or more and 500 Pa-s or less. When the melt viscosity of the present copolymer at 130° C. is within the above-described range, coating by a hot-melt method, in which the present resin composition is heated as it is and applied, can be performed. The above-described lower limit and upper limit of the melt viscosity of the present copolymer at 130° C. can be arbitrarily combined.

The melt viscosity can be measured, for example, using a viscoelasticity measuring apparatus Rheosol-G5000 manufactured by UBM. In the present invention, a value of a viscosity (1)*) measured at a strain of 0.7% at 130° C. and 0.02 Hz using a 25 mmφ cone plate is used as the value of the melt viscosity at 130° C.

The present copolymer preferably has a specific dielectric constant of 3.5 or less. When the specific dielectric constant is 3.5 or less, it is possible to reduce the thickness of the adhesive layer when the adhesive sheet is mounted on a touch panel, and reactivity of the touch panel is favorable.

The deformation amount of the present copolymer in a creep test under conditions of 23° C., 100 Pa, and 10 minutes (hereinafter, also referred to as "deformation amount at 23° C.") is preferably 15% or less, more preferably 10% or less, and still more preferably 5% or less. The lower limit of the deformation amount at 23° C. is not particularly limited, but is, for example, 1%. When the deformation amount at 23° C. is the above-described upper limit value or less, the adhesive layer to be formed has excellent shape holding power when not bonded, and problems such as bleeding out of the adhesive layer from the separate films in a state in which the adhesive layer is sandwiched between the separate films, adhesive residue being generated when the adhesive layer and the separate film are peeled off, and decrease in yield because re-peeling cannot be performed after the lamination are less likely to occur.

The deformation amount at 23° C. can be adjusted by, for example, the proportion of the constituent unit derived from the alkyl (meth)acrylate (a) in the macromonomer (A1), and the molecular weight of the macromonomer and the present copolymer. For example, when the proportion of the constituent unit derived from the alkyl (meth)acrylate (a) in the macromonomer (A1) is increased, the deformation amount at 23° C. tends to be decreased.

Detailed method of measuring the deformation amount in the creep test is as described in Examples later.

A deformation amount of the present copolymer in a creep test under conditions of 70° C., 1000 Pa, and 1 minutes (hereinafter, also referred to as "deformation amount at 70° C.") is preferably 100% or more, more preferably 200% or more, and still more preferably 300% or more. The upper limit of the deformation amount at 70° C. is not particularly limited, but is, for example, 1000%. When the deformation amount at 70° C. is the above-described lower limit value or more, the adhesive layer to be formed has excellent unevenness followability during bonding, and even when unevenness exists on at least one surface of a member to be bonded, air bubbles are unlikely to remain between the adhesive layer and the unevenness.

The deformation amount at 70° C. can be adjusted by, for example, the proportion of the constituent unit derived from the alkyl (meth)acrylate (a) in the macromonomer (A1), and the molecular weight of the macromonomer and the present copolymer. For example, when the proportion of the constituent unit derived from the alkyl (meth)acrylate (a) in the macromonomer (A1) is increased, the deformation amount at 70° C. tends to be increased.

A storage modulus G' of the present copolymer at −20° C. and 1 Hz (hereinafter, also referred to as "G' at −20° C.") is preferably 700 kPa or less, more preferably 400 kPa or less, and still more preferably 200 kPa or less. The lower limit of G' at −20° C. is not particularly limited, but is, for example, 10 kPa. When G' at −20° C. is the above-described upper limit value or less, the adhesive layer to be formed has excellent flexibility during use at the low temperatures.

For example, in the application for a foldable display, a member bonded through the adhesive layer may be folded at low temperatures. When the adhesive layer has excellent flexibility during use at the low temperatures, as the member bonded through the adhesive layer is folded at the low temperatures, the member can be protected and the adhesive layer itself has favorable durability.

G' at −20° C. can be adjusted by, for example, the proportion of the constituent unit derived from the alkyl (meth)acrylate (a) in the macromonomer (A1), and the proportion of the macromonomer (A1) in the present copolymer. For example, when the proportion of the constituent unit derived from the alkyl (meth)acrylate (a) in the macromonomer (A1) is increased, G' at −20° C. tends to be decreased.

A detailed method of measuring the storage modulus G' is as described in Examples later.

In the present copolymer, it is preferable that the deformation amount at 23° C. is 15% or less, the deformation amount at 70° C. is 100% or more, and G' at −20° C. is 700 kPa or less. More preferred value of the deformation amount at 70° C., more preferred value of the deformation amount at 23° C., and more preferred value of G' at −20° C. are as described above.

A method for producing the present copolymer is not particularly limited. For example, when the macromonomer (A1) has a radically polymerizable group, it is possible to use a method of polymerizing a monomer mixture including the macromonomer (A1) and including at least one of the alkyl (meth)acrylate (B1) and the vinyl monomer (B2). The monomer mixture may further include the vinyl monomer (B3).

As the polymerization method, a known polymerization method such as a solution polymerization method, a suspension polymerization method, and an emulsion polymerization method can be used. In order to be used as an adhesive sheet, a solution polymerization method is preferable.

When the macromonomer (A1) has an addition-reactive functional group and at least a part of the vinyl monomer (B) has a functional group which can react with the functional group of the macromonomer (A1), a method in which a polymer of the vinyl monomer (B) is reacted (subjected to an addition reaction) with the macromonomer (A1) can be used.

The adhesive composition can contain at least one of a polymer having only the constituent unit derived from the macromonomer (A1), a polymer having only the constituent unit derived from the vinyl monomer (B), an unreacted macromonomer (A1), and an unreacted vinyl monomer (B).

The amount of the (meth)acrylic copolymer in the adhesive composition forming the adhesive layer of the adhesive sheet according to the embodiment is preferably 50% by mass or more and 99.5% by mass or less, more preferably 75% by mass or more and 99% by mass or less, and still more preferably 90% by mass or more and 98% by mass or less with respect to 100% by mass of the adhesive composition. The above-described lower limit and upper limit of the amount of the (meth)acrylic copolymer can be arbitrarily combined.

The amount of the (meth)acrylic copolymer in the adhesive composition may be 100% by mass.

In addition, in the adhesive sheet according to the embodiment, from the viewpoint that the creep strain in the requirement (1) is easily adjusted and an adhesive sheet having excellent unevenness followability is easily obtained, the present copolymer is preferably a copolymer including a constituent unit derived from an alkyl (meth)acrylate (a) having an alkyl group having 8 or more and 30 or less carbon atoms and a constituent unit derived from a vinyl monomer (B) other than the alkyl (meth)acrylate (a), in which the constituent unit derived from the vinyl monomer (B) has a constituent unit derived from a vinyl monomer (B2) including a polar group (also referred to as "copolymer (II)").

As the alkyl (meth)acrylate (a) having an alkyl group having 8 or more and 30 or less carbon atoms and the vinyl monomer (B) other than the alkyl (meth)acrylate (a), the same monomers as the monomers for obtaining the above-described copolymer (I) can be used.

The proportion of the constituent unit derived from the alkyl (meth)acrylate (a) to 100% by mass of all constituent units constituting the copolymer (II) is preferably 1% by mass or more and 60% by mass or less, more preferably 3% by mass or more and 50% by mass or less, still more preferably 3% by mass or more and 40% by mass or less, even more preferably 3% by mass or more and 35% by mass or less, even still more preferably 5% by mass or more and 30% by mass or less, and particularly preferably 10% by mass or more and 30% by mass or less. When the above-described proportion is set, an adhesive sheet having excellent flexibility in a low-temperature environment tends to be obtained. The above-described lower limit and upper limit of the proportion of the constituent unit derived from alkyl (meth)acrylate (a) can be arbitrarily combined.

The proportion of the constituent unit derived from the vinyl monomer (B) to 100% by mass of all constituent units constituting the copolymer (II) is preferably 40% by mass or more and 99% by mass or less, more preferably 50% by mass or more and 97% by mass or less, still more preferably 60% by mass or more and 97% by mass or less, even more preferably 65% by mass or more and 97% by mass or less, even still more preferably 70% by mass or more and 95% by mass or less, and particularly preferably 70% by mass or more and 90% by mass or less.

The proportion of the constituent unit derived from the vinyl monomer (B2) to 100% by mass of all constituent units constituting the present copolymer is preferably 1% by mass or more and 50% by mass or less, more preferably 1% by mass or more and 20% by mass or less, still more preferably 2% by mass or more and 15% by mass or less, and even more preferably 3% by mass or more and 10% by mass or less. When including the constituent unit derived from the vinyl monomer (B2) within the above-described range, an adhesive sheet having excellent flexibility tends to be obtained. The above-described lower limit and upper limit of the proportion of the constituent unit derived from the vinyl monomer (B2) can be arbitrarily combined.

[Crosslinking Agent]

The adhesive composition forming the adhesive layer preferably contains a crosslinking agent in addition to the (meth)acrylic copolymer.

The crosslinking agent is a compound or a composition which forms a crosslinked structure, and a polyfunctional (meth)acrylate is preferable. As the polyfunctional (meth)acrylate, for example, a (meth)acrylic monomer having two or more functional groups and a (meth)acrylic oligomer are exemplary examples.

As the (meth)acrylic monomer, for example, 1,4-butanediol di(meth)acrylate, glycerin di(meth)acrylate, neopentyl glycol di(meth)acrylate, glycerin glycidyl ether di(meth)acrylate, 1,6-hexanediol di(meth)acrylate, 1,9-nonanediol di(meth)acrylate, tricyclodecane dimethacrylate, tricyclodecane dimethanol di(meth)acrylate, bisphenol A polyethoxy di(meth)acrylate, bisphenol A polypropoxy di(meth)acrylate, bisphenol F polyethoxy di(meth)acrylate, ethylene glycol di(meth)acrylate, neopentyl glycol di(meth)acrylate, trimethylolpropane trioxyethyl (meth)acrylate, ε-caprolactone-modified tris(2-hydroxyethyl)isocyanurate tri(meth)acrylate, pentaerythritol tri(meth)acrylate, propoxylated pentaerythritol tri(meth)acrylate, ethoxylated pentaerythritol tri(meth)acrylate, pentaerythritol tetra(meth)acrylate, propoxylated pentaerythritol tetra(meth)acrylate, ethoxylated pentaerythritol Tetra(meth)acrylate, dipentaerythritol hexa(meth)acrylate, polyethylene glycol di(meth)acrylate, polypropylene glycol di(meth)acrylate, polytetramethylene glycol di(meth)acrylate, tris(acryloxyethyl)isocyanurate, dipentaerythritol hexa(meth)acrylate, dipentaerythritol penta(meth)acrylate, tripentaerythritol hexa(meth)acrylate, tripentaerythritol penta(meth)acrylate, neopentyl hydroxybivalate glycol di(meth)acrylate, di(meth)acrylate of ε-caprolactone adduct of neopentyl hydroxybivalate, trimethylolpropane tri(meth)acrylate, trimethylolpropane polyethoxytri(meth)acrylate, and ditrimethylolpropane tetra(meth)acrylate are exemplary examples.

Among these, from the viewpoint of imparting appropriate toughness to the cured product, a polyfunctional (meth) acrylic monomer having an alkylene glycol skeleton, such as polyethylene glycol di(meth)acrylate, polypropylene glycol di(meth)acrylate, and polytetramethylene glycol di(meth) acrylate, is more preferable.

From the viewpoint of imparting appropriate flexibility to the cured product, a molecular weight of the (meth)acrylic monomer is preferably 200 or more, more preferably 300 or more, still more preferably 400 or more, and particularly preferably 500 or more. The upper limit of the molecular weight is usually 3,000 or less, preferably 2,000 or less.

As the (meth)acrylic oligomer, for example, polyfunctional (meth)acrylic oligomers such as polyester (meth) acrylate, epoxy (meth)acrylate, urethane (meth)acrylate, and polyether (meth)acrylate are exemplary examples. Among these, from the viewpoint of imparting appropriate toughness to the cured product, urethane (meth)acrylate-based oligomer is preferable.

When the adhesive sheet according to the embodiment is cured, from the viewpoint that a cured product having high toughness is obtained, in other words, from the viewpoint that a cured product with appropriate flexibility is obtained, a molecular weight of the (meth)acrylic oligomer is preferably 3,000 or more, more preferably 5,000 or more, still more preferably 8,000 or more, and particularly preferably 10,000 or more. The upper limit of the molecular weight is usually 100,000 or less, preferably 50,000 or less.

As the crosslinking agent, for example, isocyanate-based, epoxy-based, metal chelate-based, photocurable, melamine-based, or aziridine-based crosslinking agent may be used. It is also possible to use a combination of two or more kinds of these crosslinking agents.

As the isocyanate-based crosslinking agent, for example, aromatic polyisocyanates such as xylylene diisocyanate, diphenylmethane diisocyanate, triphenylmethane triisocyanate, and tolylene diisocyanate; aliphatic or alicyclic polyisocyanates such as hexamethylene diisocyanate, isophorone diisocyanate, and a hydrogenated product of the aromatic polyisocyanate; a dimer or trimer of these polyisocyanates; and adducts consisting of these polyisocyanates and polyols such as trimethylolpropane are exemplary examples. One kind of these compounds may be used, or two or more kinds thereof may be used in combination.

As the epoxy-based crosslinking agent, for example, ethylene glycol diglycidyl ether, polyethylene glycol diglycidyl ether, 1,6-hexanediol diglycidyl ether, a bisphenol A-type epoxy resin, N,N,N',N'-tetraglycidyl-m-xylene diamine, 1,3-bis(N,N-diglycidylaminomethyl)cyclohexane, N,N-diglycidylaniline, and N,N-diglycidyltoluidine are exemplary examples.

As the metal chelate-based crosslinking agent, for example, crosslinking agents in which a polyvalent metal is covalently bonded or coordinate-bonded to an organic compound are exemplary examples. As the polyvalent metal, for example, aluminum, nickel, chromium, copper, iron, tin, titanium, zinc, cobalt, manganese, and zirconium are exemplary examples. As the organic compound to be covalently bonded or coordinate-bonded, ketone compounds such as acetylacetone and compounds having an oxygen atom, such as alkyl ester, an alcohol compound, a carboxylic acid compound, and an ether compound, are exemplary examples.

As the melamine-based crosslinking agent, for example, hexamethoxymethylmelamine, hexaethoxymethylmelamine, hexapropoxymethylmelamine, hexaptoxymethylmelamine, hexapentyloxymethylmelamine, hexahexyloxymethylmelamine, and a melamine resin are exemplary examples.

As the aziridine-based crosslinking agent, for example, tetramethylolmethane-tri-β-aziridinylpropionate, trimethylolpropane-tri-β-aziridinylpropionate, N,N'-diphenylmethane-4,4'-bis(1-aziridinecarboxamide), and N,N'-hexamethylene-1,6-bis(1-aziridinecarboxamide) are exemplary examples.

From the viewpoint that it is possible to impart durability when forming a laminate from the adhesive sheet, the amount of the crosslinking agent in the adhesive composition forming the adhesive layer is preferably 0.1 parts by mass or more, more preferably 0.5 parts by mass or more, still more preferably 1.0 part by mass or more, even more preferably 1.2 parts by mass or more, and particularly preferably 1.5 parts by mass or more with respect to 100 parts by mass of the (meth)acrylic copolymer. On the other hand, from the viewpoint of ensuring the shape retention or the adhesiveness of the adhesive sheet, the amount of the crosslinking agent is preferably 10 parts by mass or less, more preferably 5 parts by mass or less, still more preferably 3 parts by mass or less, and particularly preferably 2 parts by mass or less with respect to 100 parts by mass of the (meth)acrylic copolymer. The above-described lower limit and upper limit of the amount of the crosslinking agent can be arbitrarily combined.

[Photopolymerization Initiator]

The adhesive composition forming the adhesive layer preferably contains a photopolymerization initiator in addition to the (meth)acrylic copolymer.

As the photopolymerization initiator, a compound which generates active radical species when irradiated with light such as ultraviolet rays and visible light, more specifically, light having a wavelength of 200 nm to 780 nm can be used.

As a cleavage-type photoinitiator, for example, 2,2-dimethoxy-1,2-diphenylethan-1-one, 1-hydroxycyclohexylphenylketone, 2-hydroxy-2-methyl-1-phenyl-propan-1-one, 1-(4-(2-hydroxyethoxy)phenyl)-2-hydroxy-2-methyl-1-propan-1-one, 2-hydroxy-1-[4-{4-(2-hydroxy-2-methyl-propionyl)benzyl}phenyl]-2-methyl-propan-1-one, oligo(2-hydroxy-2-methyl-1-(4-(1-methylvinyl)phenyl)propanone), methyl phenylglyoxylic acid, 2-benzyl-2-dimethylamino-1-(4-morpholinophenyl)butan-1-one, 2-methyl-1-[4-(methylthio)phenyl]-2-morpholinopropan-1-one, 2-(dimethylamino)-2-[(4-methylphenyl)methyl]-1-[4-(4-morpholinyl) phenyl]-1-butanone, bis(2,4,6-trimethylbenzoyl)-phenylphosphine oxide, 2,4,6-trimethylbenzoyldiphenylphosphine oxide, (2,4,6-trimethylbenzoyl)ethoxyphenylphosphine oxide, bis(2,6-trimethylbenzoyl) 2,4,4-trimethylpentylphosphine oxide, and derivatives of these compounds are exemplary examples.

As a hydrogen abstraction-type photoinitiator, for example, benzophenone, 4-methyl-benzophenone, 2,4,6-trimethylbenzophenone, 4-phenylbenzophenone, 3,3'-dimethyl-4-methoxybenzophenone, 4-(meth)acryloyloxybenzophenone, methyl 2-benzoylbenzoate, methyl benzoyl formate, bis(2-phenyl-2-oxoacetic acid)oxybisethylene, 4-(1,3-acryloyl-1,4,7,10,13-pentaoxotridecyl)benzophenone, thioxanthone, 2-chlorothioxanthone, 3-methylthioxanthone, 2,4-dimethylthioxanthone, 2-methylanthraquinone, 2-ethylanthraquinone, 2-tert-butylanthraquinone, 2-aminoanthraquinone, and derivatives of these compounds are exemplary examples.

The photopolymerization initiator may be any of the cleavage-type photoinitiator or the hydrogen abstraction-type photoinitiator, each of which may be used alone or the both may be mixed and used, and each of which may be used alone or a combination of two or more kinds may be used.

When the hydrogen abstraction-type photoinitiator is used as the photoinitiator, a hydrogen abstraction reaction also occurs from the present copolymer and not only the active energy ray-curable compound but also the present copolymer is incorporated into the crosslinked structure, and a crosslinked structure with many crosslinking points can be formed, which is preferable.

From the viewpoint of durability when forming a laminate from the adhesive sheet, the amount of the photopolymerization initiator in the adhesive composition forming the adhesive layer is preferably 0.1 parts by mass or more, more preferably 0.3 parts by mass or more, still more preferably 0.5 part by mass or more, and particularly preferably 1 part by mass or more with respect to 100 parts by mass of the (meth)acrylic copolymer. On the other hand, from the viewpoint of ensuring the shape retention or the adhesiveness of the adhesive sheet, the amount of the photopolymerization initiator is preferably 10 parts by mass or less, more preferably 5 parts by mass or less, still more preferably 3 parts by mass or less, and particularly preferably 2 parts by mass or less with respect to 100 parts by mass of the (meth)acrylic copolymer. The above-described lower limit and upper limit of the amount of the photopolymerization initiator can be arbitrarily combined.

Any one of the crosslinking agent and the photopolymerization initiator may be used, or the both may be used.

[Other Components]

The adhesive composition forming the adhesive layer may contain known components which are blended in a general adhesive composition.

As necessary, various additives such as a silane coupling agent, a tackifier resin, a plasticizer, an antioxidant, a photostabilizer, a metal deactivator, an anti-aging agent, a moisture absorbent, a polymerization inhibitor, an ultraviolet absorber, a rust inhibitor, inorganic particles, a sensitizer, a pigment, a hydrolysis inhibitor, and a reaction catalyst (a tertiary amine compound, a quaternary ammonium compound, a tin laurate compound, and the like) may be added to the adhesive composition forming the adhesive layer. It is preferable that the amount of these additives is typically set to not adversely affect the curing of the adhesive sheet or to not adversely affect the physical characteristics of the adhesive sheet.

For example, a filler can be contained in order to impart heat resistance, thermal conductivity, flame retardancy, electrical conductivity, or the like. As the filler, for example, metallic powders such as zinc oxide powder and titanium oxide powder; carbon black such as acetylene black, inorganic fillers such as talc, glass powder, silica powder, conductive particles, and glass powder; and organic fillers such as polyethylene powder, polyester powder, polyamide powder, fluororesin powder, polyvinyl chloride powder, epoxy resin powder, and silicone resin powder are exemplary examples. One kind of these fillers may be used, or two or more kinds thereof may be mixed and used.

As the type of the antioxidant, for example, phenol-based, phosphorus-based, hydroxylamine-based, and sulfur-based antioxidants are exemplary examples. Among these, phenol-based or phosphoric acid-based antioxidants, with which coloring of the resin after heating is small, are preferable. These may be used alone or a combination of a plurality thereof may be used.

The amount of the antioxidant is preferably in a range of 0.1 to 5 parts by mass with respect to 100 parts by mass of the present copolymer.

The adhesive composition can be produced, for example, by a method of producing the present copolymer as described above and adding other components as necessary.

[Method for Manufacturing Adhesive Sheet]

The adhesive composition can be molded into a sheet shape, and used as an adhesive sheet.

A method for manufacturing the adhesive sheet according to the embodiment is not particularly limited. For example, it can be prepared as a solvent-free hot-melt adhesive composition. When using the hot-melt-based adhesive composition in which a solvent is not used, as compared with an adhesive composition using a solvent, the thickness can be made thicker, so that, for example, the adhesive sheet can be made thick enough to fill the gaps between the constituent members of the image display device.

For example, the adhesive sheet according to the embodiment can be obtained by mixing the (meth)acrylic copolymer, at least one of the crosslinking agent and the photopolymerization initiator used as needed, the additive, and the like in a predetermined amount to prepare an adhesive composition, and molding the adhesive composition into a sheet shape. As necessary, the adhesive sheet after the molding may be temporary cured.

As a method of mixing each component, a method using a single-screw extruder, a twin-screw extruder, a planetary mixer, a twin-screw mixer, or a pressure kneader is an exemplary example.

As a method of molding the adhesive composition into a sheet shape, for example, a wet lamination method, a dry lamination method, a cast extrusion method using a T-die, an extrusion lamination method, a calendering or inflation method, an injection molding method, and a liquid injection curing method are exemplary examples.

The adhesive sheet according to the embodiment may be formed by dissolving the adhesive composition in an appropriate solvent and coating using various coating methods. In addition, it is also possible to carry out the coating by diluting with other polymerizable components or crosslinking agents and curing by ultraviolet irradiation, heating, or the like.

The adhesive sheet obtained from the adhesive composition can be used to adhere various members and exhibits very favorable adhesive performance. For example, by applying the adhesive sheet to a transparent plastic film or processing the adhesive sheet into an adhesive film, the adhesive sheet can be used for bonding a window adhesive film for a vehicle or a building, or for bonding labels for a label display. In addition, by processing the adhesive sheet into a transparent double-sided adhesive sheet shape, the adhesive sheet can be used for bonding various panels in an image display device such as a liquid crystal panel, for bonding a transparent plate material such as glass, or the like.

In addition, when the adhesive composition is used for the coating in a solution state using a solvent or a solution state diluted with components other than the present copolymer, the adhesive composition can be used for the same applications as the adhesive sheet described above.

As described above, in the adhesive sheet satisfying the requirements (1) to (3) of the example of the embodiment, a high level of both unevenness followability during bonding and shape holding power when not bonded can be achieved, and the flexibility in a low-temperature environment is also excellent.

In addition, since the adhesive composition of the example of the embodiment has excellent unevenness followability during bonding and shape holding power when not bonded, the adhesive composition is useful for bonding members in which at least one member has an uneven surface (uneven member).

For example, when the uneven member and a member having an organic light emitting diode (OLED) are bonded to each other by the adhesive composition, since the adhesive composition fills the unevenness of the uneven member without any gaps and smoothes the surface on the OLED side, a clear image without uneven patterns can be displayed.

In particular, in addition to the above-described characteristics, the flexibility during use at the low temperatures is also excellent, so that the adhesive composition is suitable for bonding a member constituting a foldable display (OLED, a protective film, an uneven substrate for a pressure-sensitive sensor, a polarizing plate with a camera hole, and the like).

<Adhesive Sheet with Release Film>

Another embodiment of the present invention relates to an adhesive sheet with a release film.

In the adhesive sheet according to the embodiment, it is preferable that a release film is laminated on at least one surface of the adhesive sheet before bonding, and it is more preferable that release films are laminated on both surfaces thereof. An aspect in which a plurality of adhesive sheets are laminated with a release film interposed therebetween may be used.

As the release film, for example, a polyester film, a polyolefin film, a polycarbonate film, a polystyrene film, an acrylic film, a triacetyl cellulose film, and a fluororesin film are exemplary examples. Among these, a polyester film or a polyolefin film is preferable, and a polyester film is more preferable.

In addition, since it is easy to peel off from the adhesive sheet after being irradiated with active energy ray, the release film is preferably a film in which a peeling force measured with an adhesive sheet irradiated with active energy ray having a wavelength of 365 nm with an integrated light amount of 1000 to 5000 mJ/$cm^2$ is 0.1 N/cm or less in conditions of a peeling angle of 1800 and a peeling speed of 300 mm/min.

From the viewpoint of processability and handleability, the thickness of the release film is preferably 25 μm or more and 500 μm or less, more preferably 38 μm or more and 250 μm or less, and still more preferably 50 μm or more and 200 μm or less. The above-described lower limit and upper limit of the thickness of the release film can be arbitrarily combined.

<Laminate for Image Display Device>

Another embodiment of the present invention relates to a laminate for an image display device.

In the laminate for an image display device according to the embodiment, two members for constituting an image display device are laminated through the adhesive sheet according to the embodiment of the present invention, in which at least one of the members for constituting an image display device has a step with a height difference of 2 μm or more on a contact surface with the adhesive sheet.

Since the adhesive sheet according to the embodiment of the present invention has excellent unevenness followability, the adhesive sheet is deformed by following the step on the surface of the member for constituting an image display device, and two members for constituting an image display device can be bonded together while absorbing the step.

The image display device constituent member is not particularly limited, and for example, a cover lens, a polarizing plate, a phase difference film, a barrier film, a touch sensor film, a light emitting element, PSA, a color filter, a flexible printed circuit board, a metal substrate, and a hard plate are exemplary examples.

A material of the member for constituting an image display device is not particularly limited. For example, resin sheets having, as a main component, a resin such as a urethane resin, a cycloolefin resin, a triacetyl cellulose resin, a (meth)acrylate resin, an epoxy resin, and a polyimide resin; thin film glass; and metals are exemplary examples. The "main component" herein means a component having the highest mass ratio among components constituting the member for constituting an image display device, and the mass ratio is preferably 50% by mass or more, more preferably 55% by mass or more, and still more preferably 60% by mass or more.

The step of the member for constituting an image display device on the contact surface with the adhesive sheet is not particularly limited, and various unevenness caused by wiring, printing, pattern development, surface treatment, embossing processing, and the like are exemplary examples.

The height difference of the step of the member for constituting an image display device is preferably 2 μm or more, more preferably 3 μm or more, and still more preferably 4 μm or more, and is preferably 10 μm or less, more preferably 8 μm or less, still more preferably 7 μm or less, and particularly preferably 6 μm or less. The above-described lower limit and upper limit of the height difference of the step can be arbitrarily combined.

The step of the member for constituting an image display device on the contact surface with the adhesive sheet may be, for example, unevenness provided with a height difference of 2 to 10 μm and an interval of 10 mm or less.

From the viewpoint that the handleability is favorable, the thickness of the laminate for an image display device according to the embodiment is preferably 0.02 mm or more, more preferably 0.03 mm or more, and still more preferably 0.05 mm or more. From the viewpoint that the laminate can be made thinner, the thickness of the laminate for an image display device according to the embodiment is preferably 1.0 mm or less, more preferably 0.7 mm or less, and still more preferably 0.5 mm or less. The above-described lower limit and upper limit of the thickness of the laminate for an image display device can be arbitrarily combined.

A method for manufacturing the laminate for an image display device according to the embodiment is not particularly limited.

For example, a method in which the adhesive sheet according to the embodiment of the present invention is bonded to one member for constituting an image display device on a surface having a step, the adhesive sheet is irradiated with active energy ray, the other member for constituting an image display device is bonded to the adhesive sheet on the other surface, and the adhesive sheet is hot-melt as necessary by subjecting the adhesive sheet to a heating treatment is an exemplary example. The adhesive sheet according to the embodiment of the present invention can be hot-melt even after curing by active energy ray, and can be bonded so that it follows the step and absorbs the step.

When using an adhesive sheet with a release film, in which release films are laminated on both surfaces of the adhesive sheet, an adhesive sheet in which one release film has been peeled off is bonded to the member for constituting an image display device on a surface having a step, and the adhesive sheet is irradiated with active energy ray through the other release film. Thereafter, the other release film is peeled off, the other member for constituting an image display device is bonded to the adhesive sheet on the other surface, and the adhesive sheet is hot-melt as necessary by subjecting the adhesive sheet to a heating treatment.

After irradiating the adhesive sheet with active energy ray to cure (fully curing), the adhesive sheet may be bonded to each of two members for constituting an image display device.

When at least one of two members for constituting an image display device transmits light, a method in which the two members for constituting an image display device, which have a step on at least one adhesive surface, are laminated through the adhesive sheet according to the embodiment of the present invention, and then the adhesive sheet is irradiated with active energy ray through the member for constituting an image display device, which transmits light, may be adopted.

As the active energy ray to be radiated, ionizing radiation such as α-rays, β-rays, γ-rays, neutron beams, and electron beams, ultraviolet rays, and visible light are exemplary examples. Among these, from the viewpoint of suppressing damage to the member for constituting an image display device and controlling the reaction, ultraviolet rays are preferable.

As a light source for radiating the active energy ray, for example, a high-pressure mercury lamp, a metal halide lamp, a xenon lamp, a halogen lamp, an LED lamp, and a fluorescent lamp are exemplary examples.

From the viewpoint of step absorption properties, the irradiation amount of the active energy ray is preferably 5000 mJ/$cm^2$ or less, more preferably 4500 mJ/$cm^2$ or less, and still more preferably 4200 mJ/$cm^2$ or less. From the viewpoint of sufficient curing, the irradiation amount of the active energy ray is preferably 2000 mJ/$cm^2$ or more, more preferably 3000 mJ/$cm^2$ or more, and still more preferably 3500 mJ/$cm^2$ or more. The above-described lower limit and upper limit of the irradiation amount of active energy ray can be arbitrarily combined.

A method of bonding the adhesive sheet on the surface of the member for constituting an image display device, having a step, is not particularly limited, and for example, a known method such as roll bonding, press bonding using a parallel plate, and diaphragm bonding can be used. A bonding environment may be either an air bonding method of carrying out bonding at normal pressure or a vacuum bonding method of carrying out bonding under reduced pressure.

A heating temperature during the heating treatment when the adhesive sheet is hot-melt is preferably 40° C. or higher and 100° C. or lower, more preferably 50° C. or higher and 90° C. or lower, and still more preferably 55° C. or higher and 85° C. or lower.

When the adhesive sheet is hot-melt, a press pressure may be applied to the laminate in combination with the heating treatment.

<Flexible Image Display Device>

Still another embodiment of the present invention relates to a flexible image display device.

The "flexible image display device" means an image display device that does not leave any bending marks even after repeated bending, folding, or rolling up operations, and when released from the bent, folded, or rolled up state, quickly recovers to the state before the operation and displays images without distortion.

The flexible image display device according to the embodiment includes the laminate for an image display device according to the embodiment of the present invention. In the flexible image display device according to the embodiment, for example, the laminate for an image display device is disposed on a side of an image display panel opposite to the viewer side, that is, on a light source side.

In the flexible image display device according to the embodiment, other members may be further laminated between the image display panel and the laminate for an image display device according to the embodiment of the present invention or on a side of the laminate for an image display device according to the embodiment of the present invention opposite to the image display panel. As the other members, the same image display device constituent members as those mentioned in the description of the laminate for an image display device according to the embodiment are exemplary examples.

In the flexible image display device according to the embodiment, even when the image display device constituent member on the contact surface with the adhesive sheet has a step with, for example, a height difference of 2 μm or more, the adhesive sheet follows and absorbs the step, suppressing the generation of bubbles, and also suppresses delamination or cracking even when bent, folded, or rolled up in a low-temperature environment.

The present invention is not limited to the embodiments described above. Within a range not departing from the gist of the present invention, it is possible to appropriately substitute the constituent elements in the above-described embodiments with known constituent elements, and the above-described modification examples may be appropriately combined.

A more detailed description will be given below of the present invention using Examples and Comparative Examples. However, the present invention is not limited to these examples in any way. "part" in Examples means "part by mass".

1. First Test

Measurement and evaluation in Examples were carried out by the methods shown below.

(Molecular Weight of Macromonomer)

A tetrahydrofuran solution of 0.2% by mass of the macromonomer (A1) was prepared, 10 μL of the solution was injected into a GPC apparatus (manufactured by Tosoh Corporation, HLC-8320) equipped with columns manufactured by Tosoh Corporation (TSKgel SuperHZM-M×HZM-M×HZ2000 (4.6 mmID×15 cmL), TSKguardcolumn SuperHZ-L (4.6 mmID×2.0 cmL)), GPC was performed under the conditions of a flow rate of 0.35 mL/min, an eluent of tetrahydrofuran (stabilizer: BHT), and a column temperature of 40° C., and the number-average molecular weight (Mn) and the weight-average molecular weight (Mw) were determined in terms of standard polystyrene.

(Molecular Weight of (Meth)Acrylic Copolymer)

A tetrahydrofuran solution of 0.27% by mass of the (meth)acrylic copolymer was prepared, 10 μL of the solution was injected into a GPC apparatus (manufactured by Tosoh Corporation, HLC-8320) equipped with columns manufactured by Tosoh Corporation (two TSKgel SuperHZMH (6.0 mmID×15 cmL), TSKguardcolumn SuperHZ-H (4.6 mmID×3.5 cmL)), GPC was performed under the conditions of a flow rate of 0.5 mL/min, an eluent of tetrahydrofuran (stabilizer: BHT), and a column temperature of 40° C., and the number-average molecular weight (Mn) and the weight-average molecular weight (Mw) were determined in terms of standard polystyrene.

(Non-Volatile Content and Volatile Content)

Approximately 1 g of a sample was placed on an aluminum dish, dried in an oven equipped with a blower at 105° C. for 2 hours, the mass before and after the drying was measured on an electronic balance, and the concentration of non-volatile content was obtained according to the following expression.

Concentration of non-volatile content (%)=(Mass of sample after drying (g)/Mass of sample before drying (g))×100

The concentration of volatile content was determined according to the following expression.

Concentration of volatile content (%)=100−Concentration of non-volatile content (%)

(Creep Test)

An operation in which a release film on one side was removed from an adhesive sheet with a release film, which was produced in each example, and the adhesive sheets were laminated using a hand roller was repeated to adjust the thickness thereof to approximately 0.8 mm, and the laminate was punched out into a circular shape with a diameter of 8 mm to obtain a sample. The obtained sample was placed in a rheometer ("DHR-2" manufactured by TA Instruments.), and a strain (creep strain) (%) of the obtained sample after 600 seconds was measured under the conditions of a measurement jig of 8 mm-diameter parallel plate, a temperature of 60° C., and a pressure of 2000 Pa.

(Holding Power)

A release film on one side was removed from an adhesive sheet with a release film, which was produced in each example and cut into 40 mm×50 mm, and a PET film (manufactured by Mitsubishi Chemical Corporation, DIAFOIL S-100, thickness: 38 μm) was bonded to the adhesive sheet as a film for backing using a hand roller. The laminate was cut into strips with a width of 20 mm and a length of 100 mm to obtain a test piece. Next, the remaining release film was peeled off, and one end portion of the laminate in a longitudinal direction was adhered to a SUS plate (120 mm×50 mm×1.2 mm in thickness) using a hand roller so that an adhesive area was 20 mm×20 mm. Next, the test piece was cured for 15 minutes in an atmosphere of 40°

C., a weight of 500 gf (4.9 N) was attached to the other end portion (un-adhered portion) of the test piece, the SUS plate was placed in a vertical direction such that the weight side was bottom, and a time (seconds) until the weight fell was measured.

(Storage Shear Modulus G' Before Curing)

An operation in which a release film on one side was removed from an adhesive sheet with a release film, which was produced in each example, and the adhesive sheets were laminated using a hand roller was repeated to adjust the thickness thereof to approximately 0.8 mm, and the laminate was punched out into a circular shape with a diameter of 8 mm to obtain a sample. The obtained sample was placed in a rheometer ("DHR-2" manufactured by TA Instruments.), a dynamic viscoelasticity measurement was performed under the conditions of a measurement jig of 8 mm-diameter parallel plate, a frequency of 1 Hz, a measurement temperature of −50° C. to 150° C., and a temperature rising rate of 5° C./min, and a value of a storage shear modulus G' at −20° C. was read.

(Storage Shear Modulus G' after Curing)

Using a high-pressure mercury lamp, the adhesive sheet with a release film, which was produced in each example, was irradiated with 365 nm ultraviolet rays such that the integrated light amount was 4000 mJ/cm$^2$ for curing.

An operation in which a release film on one side was removed from the adhesive sheet with a release film after the curing and the adhesive sheets were laminated using a hand roller was repeated to adjust the thickness thereof to approximately 0.8 mm, and the laminate was punched out into a circular shape with a diameter of 8 mm to obtain a sample. The obtained sample was placed in a rheometer ("DHR-2" manufactured by TA Instruments.), a dynamic viscoelasticity measurement was performed under the conditions of a measurement jig of 8 mm-diameter parallel plate, a frequency of 1 Hz, a measurement temperature of −50° C. to 150° C., and a temperature rising rate of 5° C./min, and values of storage shear modulus G' at −20° C. and 60° C. were read.

(Adhesive Force)

Using a high-pressure mercury lamp, the adhesive sheet with a release film, which was produced in each example, was irradiated with 365 nm ultraviolet rays such that the integrated light amount was 4000 mJ/cm$^2$ for curing.

A release film on one side was removed from the adhesive sheet with a release film after the curing, and a PET film (manufactured by Mitsubishi Chemical Corporation, DIAFILM S-100, thickness: 50 μm) was bonded to the adhesive sheet as a film for backing using a hand roller. The laminate was cut into strips with a width of 10 mm and a length of 150 mm, the remaining release film was peeled off, and a PET film (manufactured by Mitsubishi Chemical Corporation, DIAFILM S-100, thickness: 50 μm), which had been bonded to soda-lime glass in advance, was bonded to the exposed adhesive surface using a hand roller. The obtained laminate was subjected to an autoclave treatment (60° C., gauge pressure of 0.2 MPa, and 20 minutes) for finish bonding, thereby producing a measurement sample of adhesive force.

With regard to the obtained measurement sample of adhesive force, the film for backing was peeled off from the soda-lime glass while pulling at an angle of 180° at a peeling speed of 300 mm/min under the conditions of 60° C. and 93% RH, and a tensile strength (N/cm) was measured with a load cell to obtain the adhesive force.

(Restoration Rate)

Using a high-pressure mercury lamp, the adhesive sheet with a release film, which was produced in each example, was irradiated with 365 nm ultraviolet rays such that the integrated light amount was 4000 mJ/cm$^2$ for curing.

An operation in which a release film on one side was removed from the adhesive sheet with a release film after the curing and the adhesive sheets were laminated using a hand roller was repeated to adjust the thickness thereof to approximately 0.8 mm, and the laminate was punched out into a circular shape with a diameter of 8 mm to obtain a sample. The obtained sample was placed in a rheometer ("DHR-2" manufactured by TA Instruments.), and the restoration rate was measured under the following measurement conditions.

That is, the restoration rate was calculated by the following expression with a creep strain ($\gamma_{max}$) after applying a pressure of 2000 Pa at 60° C. for 600 seconds and a residual strain ($\gamma_{min}$) after 600 seconds from unloading the stress.

$$\text{Restoration rate } (\%)=[(\gamma_{max}-\gamma_{min})/\gamma_{max}]\times 100$$

(Used Material)

- SLMA: mixture of an alkyl methacrylate having an alkyl group having 12 carbon atoms and an alkyl methacrylate having an alkyl group having 13 carbon atoms, manufactured by Mitsubishi Chemical Corporation; trade name: Acrylic Ester SL
- MMA: methyl methacrylate, manufactured by Mitsubishi Chemical Corporation
- 2EHA: 2-ethylhexyl acrylate, manufactured by Mitsubishi Chemical Corporation
- nOA: n-octyl acrylate, manufactured by OSAKA ORGANIC CHEMICAL INDUSTRY LTD.
- nBA: n-butyl acrylate, manufactured by Mitsubishi Chemical Corporation
- 4HBA: 4-hydroxybutyl acrylate, manufactured by Mitsubishi Chemical Corporation
- HEA: 2-hydroxyethyl acrylate, manufactured by NACALAI TESQUE, INC.
- AA: acrylic acid, manufactured by Mitsubishi Chemical Corporation
- A-SA: 2-acryloyloxyethyl succinic acid, manufactured by SHIN-NAKAMURA CHEMICAL CO., LTD.
- AMBN: 2,2'-azobis(2-methylbutyronitrile), manufactured by Otsuka Chemical Co., Ltd.

<Production of Macromonomer>

Production Example 1

100 parts of SLMA, 0.00075 parts of bis[(difluoroboryl) diphenylglyoxymate] cobalt(II) as a chain transfer agent, and 58 parts of ethyl acetate were charged into a four-necked flask equipped with a stirrer, a thermometer, a cooling tube, and a nitrogen gas inlet, and oxygen was replaced by nitrogen bubbling. Next, 0.4 parts of AMBN as a polymerization initiator and 2 parts of ethyl acetate were added thereto. Next, the external temperature was raised to 90° C. in a water bath, and the reaction was carried out in a reflux state for 2 hours.

Next, 0.2 parts of AMBN and 20 parts of ethyl acetate were added dropwise thereto over 1 hour, and the reflux state was further maintained for 2 hours. Thereafter, the reaction solution was cooled to 40° C. to obtain a solution containing a macromonomer (SLMA-MM). By adding ethyl acetate to the solution, the concentration of non-volatile content was adjusted to 50% by mass.

The weight-average molecular weight of the macromonomer (SLMA-MM) was 9,420.

Production Example 2

900 parts of deionized water, 60 parts of sodium 2-sulfoethyl methacrylate, 10 parts of potassium methacrylate, and 12 parts of MMA were charged into a polymerization apparatus equipped with a stirrer, a cooling pipe, and a thermometer, and stirred, and the temperature was raised to 50° C. while replacing the inside of the polymerization apparatus with nitrogen. 0.08 parts of 2,2'-azobis(2-methylpropionamidine) dihydrochloride as a polymerization initiator was added thereto, and the temperature was further raised to 60° C. After the temperature was raised, MMA was continuously added dropwise thereto at a rate of 0.24 parts/min for 75 minutes using a drop pump. The reaction solution was maintained at 60° C. for 6 hours, and cooled to room temperature to obtain a dispersant 1 having a solid amount of 10% by mass, which was a transparent aqueous solution.

145 parts of deionized water, 0.1 parts of sodium sulfate, and 0.25 parts of the dispersant 1 (solid content: 10% by mass) were charged into a polymerization apparatus equipped with a stirrer, a cooling pipe, and a thermometer, and stirred to obtain a uniform aqueous solution. Next, 100 parts of MMA, 0.0035 parts of bis[(difluoroboryl)diphenylglyoxymate] cobalt(II) as a chain transfer agent, and 0.35 parts of PEROCTA O (manufactured by NOF CORPORATION) as a polymerization initiator were added thereto to obtain an aqueous suspension. Next, the reaction was carried out for 1 hour in a state in which the inside of the polymerization apparatus was replaced with nitrogen and the temperature was raised to 80° C., and in order to further increase the polymerization rate, the temperature was raised to 90° C. and maintained for 1 hour. Thereafter, the reaction solution was cooled to 40° C. to obtain an aqueous suspension containing the macromonomer. The aqueous suspension was filtered, and the filtrate was washed with deionized water, dehydrated, and dried at 40° C. for 16 hours to obtain a macromonomer (MMA-MA) containing MMA as a constituent unit.

The weight-average molecular weight of the macromonomer (MMA-MM) was 5,800.

Example 1

<Production of Copolymer>

25 parts of ethyl acetate as a charged solvent, 2 parts of isopropyl alcohol (IPA), and 14 parts of the macromonomer (SLMA-MM) solution (concentration: 50% by mass) were charged into a four-necked flask equipped with a stirrer, a thermometer, a cooling tube, and a nitrogen gas inlet, and the external temperature was raised to 85° C. in a water bath under nitrogen gas ventilation. After the reflux state was stabilized, a mixture consisting of 20 parts of ethyl acetate, 61 parts of nBA, 28 parts of 2EHA, 4 parts of 4HBA, and 0.13 parts of NYPER BK40 MT (manufactured by NOF CORPORATION) was added dropwise thereto over 4 hours. After finishing the dropwise addition and retaining for 1 hour, a mixture consisting of 0.3 parts of PEROCTA O (manufactured by NOF CORPORATION) and 15 parts of ethyl acetate were added thereto over 1 hour. After retaining for 2 hours, 0.5 parts of "IRGANOX 1010" (trade name, manufactured by BASF) as an antioxidant, and 23 parts of ethyl acetate were added thereto, and the mixture was cooled to room temperature to obtain a (meth)acrylic copolymer (SLMA-MM/2EHA/4HBA/nBA (mass ratio)=7/28/4/61, weight-average molecular weight: 800,000, Tg: −42° C.).

<Production of Adhesive Sheet>

100 parts (solid content) of the (meth)acrylic copolymer, 1.5 parts of a crosslinking agent (1) (manufactured by Mitsubishi Chemical Corporation, SHIKOH UV-3700B), 1.5 parts of a photopolymerization initiator (manufactured by IGM Resins, Esacure TZT), and 154.5 parts of ethyl acetate were blended to prepare an adhesive composition containing a solvent. The above-described adhesive composition was developed in a sheet shape on a release film (PET film manufactured by Mitsubishi Chemical Corporation) having a thickness of 100 μm, which had been subjected to a silicone release treatment, such that the thickness was 200 μm.

Next, the sheet-shaped adhesive composition together with the release film was put into a dryer heated to 90° C. and held for 10 minutes to volatilize the solvent contained in the adhesive composition. Furthermore, a release film (PET film manufactured by Mitsubishi Chemical Corporation) having a thickness of 75 μm, which had been subjected to a silicone release treatment, was laminated on the sheet-shaped adhesive composition in which the solvent had been dried, thereby obtaining an adhesive composition with a release film, in which the release films were laminated on both front and back sides of the adhesive sheet (sample) having a thickness of 50 μm.

The obtained adhesive sheet was an active energy ray-curable adhesive sheet having curability with active energy ray, which was cured by being irradiated with active energy ray.

Examples 2 to 12 and Comparative Examples 1 to 3

An adhesive sheet with a release film was produced in the same manner as in Example 1, except that the type of the (meth)acrylic copolymer and the type and blending amount of the crosslinking agent were changed as shown in Table 1 and Table 2.

Propoxylated pentaerythritol polyacrylate was used as a crosslinking agent (2).

Table 1 and Table 2 show the results of measurement and evaluation of the adhesive sheet of each example.

Example 13

<Production of Copolymer>

A (meth)acrylic copolymer (2EHA/4HBA/nBA (mass ratio)=31/4/65, weight-average molecular weight: 640,000, Tg: −43° C.) was obtained in the same procedure as in Example 1.

<Production of Adhesive Sheet>

100 parts (solid content) of the (meth)acrylic copolymer, 1.5 parts of a crosslinking agent (manufactured by Mitsubishi Chemical Corporation, SHIKOH UV-3700B), 1.5 parts of a photopolymerization initiator (manufactured by IGM Resins, Esacure TZT), and 154.5 parts of ethyl acetate were blended to prepare an adhesive composition containing a solvent. The above-described adhesive composition was developed in a sheet shape on a release film (PET film manufactured by Mitsubishi Chemical Corporation) having a thickness of 100 μm, which had been subjected to a silicone release treatment, such that the thickness after drying was 50 μm.

Next, the sheet-shaped adhesive composition together with the release film was put into a dryer heated to 90° C. and held for 10 minutes to volatilize the solvent contained in the adhesive composition. Furthermore, a release film (PET film manufactured by Mitsubishi Chemical Corporation) having a thickness of 75 μm, which had been subjected to a silicone release treatment, was laminated on the sheet-shaped adhesive composition in which the solvent had been dried. The adhesive composition was temporary cured by irradiation with active energy ray through the release film such that an integrated light amount at a wavelength of 365 nm was 200 mJ/$cm^2$, thereby obtaining an adhesive sheet with a release film, in which the release films were laminated on both front and back sides of the adhesive sheet (sample).

The obtained adhesive sheet was an active energy ray-curable adhesive sheet having curability with active energy ray, which was cured by being irradiated with active energy ray.

Example 14

An adhesive sheet with a release film was produced in the same manner as in Example 13, except that the (meth)acrylic copolymer having the formulation shown in Table 1 was temporary cured by irradiation with active energy ray such that an integrated light amount at a wavelength of 365 nm was 500 mJ/$cm^2$.

Table 2 shows the results of measurement and evaluation of the adhesive sheet of each example.

TABLE 1

| | | | | Example | | | | | | | | |
|---|---|---|---|---|---|---|---|---|---|---|---|---|
| | | | | 1 | 2 | 3 | 4 | 5 | 6 | 7 | 8 | 9 |
| Formulation of copolymer | Macromonomer (A1) | SLMA-MM | Part | 7 | 7 | 15 | 7 | 15 | 15 | 15 | 15 | 15 |
| | | MMA-MM | Part | — | — | — | — | — | — | — | — | — |
| | Alkyl (meth)acrylate (B1) | SLMA | Part | — | — | — | — | — | — | — | — | — |
| | | 2EHA | Part | 28 | 28 | — | — | — | — | — | — | — |
| | | nOA | Part | — | — | 26 | 28 | 26 | — | — | — | — |
| | Vinyl monomer (B2) | 4HBA | Part | 4 | 8 | 8 | 8 | — | — | 8 | — | — |
| | | HEA | Part | — | — | — | — | — | — | — | 6.3 | — |
| | | AA | Part | — | — | — | — | 4 | — | — | — | — |
| | | A-SA | Part | — | — | — | — | — | 1.9 | — | — | — |
| | Vinyl monomer (B3-1) | nBA | Part | 61 | 57 | 51 | 57 | 55 | 83 | 77 | 79 | 85 |
| | Weight-average molecular weight | | — | 800,000 | 830,000 | 940,000 | 710,000 | 700,000 | 730,000 | 430,000 | 510,000 | 460,000 |
| Blending | Crosslinking agent (1) | | Part | 1.5 | 1.5 | 1.5 | 1.5 | 1.5 | 1.5 | 1.5 | 1.5 | 1.5 |
| | Crosslinking agent (2) | | Part | — | — | — | — | — | — | — | — | — |
| | Photopolymerization initiator | | Part | 1.5 | 1.5 | 1.5 | 1.5 | 1.5 | 1.5 | 1.5 | 1.5 | 1.5 |
| Requirement (1): creep strain | | | % | 2602 | 2141 | 6056 | 1910 | 3697 | 1916 | 3712 | 1423 | 6677 |
| Requirement (2): holding power (falling time) | | | sec | 236 | 152 | 100 | 304 | 291 | 428 | 169 | 477 | 101 |
| Requirement (3): G' (−20° C.) | | | kPa | 181 | 203 | 186 | 165 | 392 | 270 | 294 | 312 | 240 |
| Requirement (4): G' (−20° C.) | | | kPa | 209 | 223 | 212 | 188 | 418 | 310 | 321 | 379 | 240 |
| Requirement (5): adhesive force (60° C., 93%) | | | N/cm | 0.9 | 0.9 | 0.7 | 0.8 | 1.3 | 0.7 | 1.0 | 1.2 | 1.1 |
| G' (60° C.) after curing | | | kPa | 19 | 19 | 18 | 19 | 20 | 20 | 21 | 23 | 16 |
| Creep strain (γmax) after curing | | | % | 44 | 50 | 57 | 38 | 66 | 80 | 84 | 79 | 269 |
| Restoration rate | | | % | 92 | 86 | 89 | 91 | 88 | 84 | 71 | 72 | 68 |

TABLE 2

| | | | | Example | | | | | Comparative Example | | |
|---|---|---|---|---|---|---|---|---|---|---|---|
| | | | | 10 | 11 | 12 | 13 | 14 | 1 | 2 | 3 |
| Formulation of copolymer | Macromonomer (A1) | SLMA-MM | Part | 7 | 7 | 7 | — | — | — | — | — |
| | | MMA-MM | Part | — | — | — | — | — | — | — | 6 |
| | Alkyl (meth)acrylate (B1) | SLMA | Part | — | — | — | — | 7 | — | 15 | — |
| | | 2EHA | Part | 31 | — | 28 | 31 | 28 | 31 | — | — |
| | | nOA | Part | — | 31 | — | — | — | — | — | — |
| | Vinyl monomer (B2) | 4HBA | Part | — | — | 4 | 4 | 4 | 4 | — | — |
| | | HEA | Part | — | — | — | — | — | — | — | — |
| | | AA | Part | 1 | 1 | — | — | — | — | — | 4 |
| | | A-SA | Part | — | — | — | — | — | — | — | — |
| | Vinyl monomer (B3-1) | nBA | Part | 61 | 61 | 61 | 65 | 61 | 65 | 85 | 90 |
| | Weight-average molecular weight | | — | 620,000 | 750,000 | 800,000 | 640,000 | 470,000 | 640,000 | 500,000 | 220,000 |
| Blending | Crosslinking agent (1) | | Part | 1.5 | 1.5 | — | 1.5 | 1.5 | 1.5 | 1.5 | — |
| | Crosslinking agent (2) | | Part | — | — | 1.5 | — | — | — | — | 1.5 |
| | Photopolymerization initiator | | Part | 1.5 | 1.5 | 1.5 | 1.5 | 1.5 | 1.5 | 1.5 | 1.5 |

TABLE 2-continued

| | | Example | | | | | Comparative Example | | |
|---|---|---|---|---|---|---|---|---|---|
| | | 10 | 11 | 12 | 13 | 14 | 1 | 2 | 3 |
| Requirement (1): creep strain | % | 8013 | 9079 | 2838 | 7627 | 12426 | 15408 | 20790 | 904 |
| Requirement (2): holding power (falling time) | sec | 92 | 76 | 311 | 92 | 69 | 58 | 53 | >1800 |
| Requirement (3): G' (−20° C.) | kPa | 198 | 156 | 158 | 159 | 159 | 136 | 145 | 1418 |
| Requirement (4): G' (−20° C.) | kPa | 231 | 185 | 234 | 189 | 177 | 198 | 192 | 2331 |
| Requirement (5): adhesive force (60° C., 93%) | N/cm | 0.9 | 0.8 | 0.4 | 0.6 | 0.8 | 1.0 | 0.6 | 3.1 |
| G' (60° C.) after curing | kPa | 16 | 15 | 29 | 19 | 13 | 20 | 13 | 24 |
| Creep strain (γmax) after curing | % | 70 | 54 | 11 | 41 | 116 | 34 | 163 | 121 |
| Restoration rate | % | 90 | 94 | 99 | 96 | 92 | 96 | 89 | 85 |

As shown in Table 1 and Table 2, it was found that the adhesive sheets of Examples 1 to 14 had a creep strain of 100000 or more and 10000000 or less, was easily deformed at high temperatures, and was excellent in unevenness followability during bonding. In addition, it was found that the holding power at 40° C. was 60 seconds or more, the deformation was less likely to occur at normal temperature, and the shape holding power was excellent. In addition, it was found that the storage shear modulus G' at −20° C. was 10 kPa or more and 1000 kPa or less, and the flexibility in a low-temperature environment was excellent. Furthermore, the adhesive force was also favorable.

On the other hand, in the adhesive sheets of Comparative Examples 1 and 2, the measured value of the holding power was less than 60 seconds, and the shape holding power when not bonded was deteriorated.

In the adhesive sheet of Comparative Example 3, it was found that the creep strain was less than 1000%, the deformation was less likely to occur at high temperatures, and the unevenness followability during bonding was deteriorated. In addition, it was found that the storage shear modulus G' at −20° C. was more than 1000 kPa, and the flexibility in a low-temperature environment was deteriorated.

2. Second Test

Measurement and evaluation in Examples were carried out by the methods shown below. Measurement and evaluation other than shown below were carried out by the same methods as in the first test.

(Creep Test)

The sample was applied onto a separate film and dried under vacuum at 130° C. for 6 hours to remove the solvent. Using a dynamic viscoelasticity measuring device (manufactured by Thermo Fisher Scientific Corporation, HAAKE MARS 60), a creep test of the obtained dried sample at 23° C. or 70° C. was performed to obtain an amount of strain (deformation amount). In the creep test, a 35 mmφ cone plate having a cone angle of 1° was used. In the creep test at 23° C., a constant stress of 100 Pa was applied and an amount of strain after 10 minutes was measured. In the creep test at 70° C., a constant stress of 1000 Pa was applied and an amount of strain after 1 minute was measured. The sample was attached to the cone plate at 130° C., and the measurement gap specified by the cone was 0.052 mm while the trimming was performed with a gap of 0.1 mm.

(Storage Modulus G')

With the dried sample produced in the same manner as in the creep test described above, using a dynamic viscoelasticity measuring device (manufactured by Thermo Fisher Scientific Corporation, HAAKE MARS 60), a storage modulus G' at −20° C. was measured. In the measurement of the storage modulus G', a 20 mmφ parallel plate was used, a gap was set to 1 mm, a frequency was set to 1 Hz, and an amount of strain was set to 0.1%. The sample was attached to the parallel plate at 130° C., and the trimming was performed with a gap of 1.05 mm.

(B-Type Viscosity)

Using a B-type viscometer (manufactured by Toki Sangyo Co., Ltd., TVB10-type viscometer) and an M4 rotor, the viscosity was measured under the conditions of a rotation speed of 60 rpm and a measurement temperature of 25° C.

(Used Material)

- MMA: methyl methacrylate, manufactured by Mitsubishi Chemical Corporation; trade name: Acrylic Ester M
- BMA: n-butyl methacrylate, manufactured by Mitsubishi Chemical Corporation; trade name: Acrylic Ester B
- EHMA: 2-ethylhexyl methacrylate, manufactured by Mitsubishi Chemical Corporation; trade name: Acrylic Ester EH
- SLMA: mixture of an alkyl methacrylate having an alkyl group having 12 carbon atoms and an alkyl methacrylate having an alkyl group having 13 carbon atoms, manufactured by Mitsubishi Chemical Corporation; trade name: Acrylic Ester SL
- iSMA: isostearyl methacrylate, manufactured by SHIN-NAKAMURA CHEMICAL CO., LTD.; trade name: NK ESTER S-1800M
- nBA: n-butyl acrylate, manufactured by Mitsubishi Chemical Corporation
- EHA: 2-ethylhexyl acrylate, manufactured by Mitsubishi Chemical Corporation
- AA: acrylic acid, manufactured by Mitsubishi Chemical Corporation
- 4HBA: 4-hydroxybutyl acrylate, manufactured by Mitsubishi Chemical Corporation
- AMBN: 2,2'-azobis(2-methylbutyronitrile), manufactured by Otsuka Chemical Co., Ltd.

Example B1

<Production of Macromonomer>

100 parts of SLMA, 0.00075 parts of bis[(difluoroboryl) diphenylglyoxymate]cobalt(II) as a chain transfer agent, and 58 parts of ethyl acetate were charged into a four-necked flask equipped with a stirrer, a thermometer, a cooling tube, and a nitrogen gas inlet, and oxygen was replaced by nitrogen bubbling. Next, 0.4 parts of AMBN as a polymerization initiator and 2 parts of ethyl acetate were added thereto. Next, the external temperature was raised to 90° C. in a water bath, and the reaction was carried out in a reflux state for 2 hours. Next, 0.2 parts of AMBN and 20 parts of ethyl acetate were added dropwise thereto over 1 hour, and the reflux state was further maintained for 2 hours. Thereafter, the reaction solution was cooled to 40° C. to obtain a solution containing the macromonomer. By adding ethyl acetate to the solution, the concentration of non-volatile content was adjusted to 50% by mass.

<Production of Copolymer>

25 parts of ethyl acetate as a charged solvent, 2 parts of isopropyl alcohol (IPA), and 30 parts of the prepared macromonomer solution (concentration: 50% by mass) were charged into a four-necked flask equipped with a stirrer, a thermometer, a cooling tube, and a nitrogen gas inlet, and the external temperature was raised to 85° C. in a water bath under nitrogen gas ventilation. After the reflux state was stabilized, a mixture consisting of 20 parts of ethyl acetate, 85 parts of nBA, and 0.13 parts of NYPER BK40 MT (manufactured by NOF CORPORATION) was added dropwise thereto over 4 hours. After finishing the dropwise addition and retaining for 1 hour, a mixture consisting of 0.3 parts of PEROCTA O (manufactured by NOF CORPORATION) and 15 parts of ethyl acetate were added thereto over 1 hour. After retaining for 2 hours, 0.5 parts of "IRGANOX 1010" (trade name, manufactured by BASF) as an antioxidant, and 23 parts of ethyl acetate were added thereto, and the mixture was cooled to room temperature to obtain a resin composition containing a (meth)acrylic copolymer (nBA/SLMA (mass ratio)=85/15).

Example B2

A resin composition containing a (meth)acrylic copolymer (nBA/4HBA/SLMA (mass ratio)=77/8/15) was obtained in the same manner as in Example B1, except that, in <Production of copolymer> of Example B1, the amount of IPA was changed from 2 parts to 3 parts, and 85 parts of nBA was changed to 77 parts of nBA and 4 parts of 4HBA.

Example B3

A resin composition containing a (meth)acrylic copolymer (nBA/EHA/AA/SLMA (mass ratio)=55/26/4/15) was obtained in the same manner as in Example B1, except that, in <Production of copolymer> of Example B1, 85 parts of nBA was changed to 55 parts of nBA, 26 parts of EHA, and 4 parts of AA.

Example B4

A resin composition containing a (meth)acrylic copolymer (nBA/EHMA (mass ratio)=85/15) was obtained in the same manner as in Example B1, except that, in <Production of macromonomer> of Example B1, SLMA was changed to EHMA, and in <Production of copolymer>, the amount of IPA was changed from 2 parts to 1.5 parts.

Example B5

A resin composition containing a (meth)acrylic copolymer (nBA/SLMA (mass ratio)=85/15) was obtained in the same manner as in Example B1, except that, in <Production of macromonomer> of Example B1, SLMA was changed to iSMA.

Example B6

A resin composition containing a (meth)acrylic copolymer (nBA/SLMA/BMA (mass ratio)=85/7/8) was obtained in the same manner as in Example B1, except that, in <Production of macromonomer> of Example B1, SLMA was changed to a mixture of SLMA and BMA (SLMA: BMA=7:8 (mass ratio)).

Example B7

A resin composition containing a (meth)acrylic copolymer (nBA/SLMA (mass ratio)=10/90) was obtained in the same manner as in Example BT, except that, in <Production of copolymer> of Example B1, the initial charged amount of ethyl acetate was changed from 25 parts to 30 parts, the initial charged amount of the macromonomer solution was changed from 30 parts to 20 parts, and the initial charged amount of nBA was changed from 85 parts to 90 parts.

Example B8

A resin composition containing a (meth)acrylic copolymer (nBA/EHMA/BMA (mass ratio)=85/11/4) was obtained in the same manner as in Example B1, except that, in <Production of macromonomer> of Example B1, SLMA was changed to a mixture of EHMA and BMA (EHMA: BMA=11:4 (mass ratio)), and in <Production of copolymer>, the amount of IPA was changed from 2 parts to 1.5 parts.

Comparative Example B1

A resin composition containing a (meth)acrylic copolymer (nBA/SLMA (mass ratio)=85/15, random copolymer) was obtained in the same manner as in Example B1, except that the <Production of macromonomer> was not performed, and in <Production of copolymer>, the initial charged amount of ethyl acetate was changed from 25 parts to 40 parts and 15 parts of SLMA was further added to the mixture to be added dropwise.

Comparative Example B2

<Production of Dispersant 1>

900 parts of deionized water, 60 parts of sodium 2-sulfoethyl methacrylate, 10 parts of potassium methacrylate, and 12 parts of MMA were charged into a polymerization apparatus equipped with a stirrer, a cooling pipe, and a thermometer, and stirred, and the temperature was raised to 50° C. while replacing the inside of the polymerization apparatus with nitrogen. 0.08 parts of 2,2'-azobis(2-methylpropionamidine) dihydrochloride as a polymerization initiator was added thereto, and the temperature was further raised to 60° C. After the temperature was raised, MMA was continuously added dropwise thereto at a rate of 0.24 parts/min for 75 minutes using a drop pump. The reaction solution was maintained at 60° C. for 6 hours, and cooled to room temperature to obtain a dispersant 1 having a solid amount of 10% by mass, which was a transparent aqueous solution.

<Production of MMA Macromonomer>

145 parts of deionized water, 0.1 parts of sodium sulfate, and 0.25 parts of the dispersant 1 (solid content: 10% by mass) were charged into a polymerization apparatus equipped with a stirrer, a cooling pipe, and a thermometer, and stirred to obtain a uniform aqueous solution. Next, 100 parts of MMA, 0.0035 parts of bis[(difluoroboryl)diphenylglyoxymate] cobalt(II) as a chain transfer agent, and 0.35 parts of PEROCTA O (manufactured by NOF CORPORATION) as a polymerization initiator were added thereto to obtain an aqueous suspension. Next, the reaction was carried out for 1 hour in a state in which the inside of the polymerization apparatus was replaced with nitrogen and the temperature was raised to 80° C., and in order to further increase the polymerization rate, the temperature was raised to 90° C. and maintained for 1 hour. Thereafter, the reaction solution was cooled to 40° C. to obtain an aqueous suspension containing the macromonomer. The aqueous suspension was filtered, and the filtrate was washed with deionized water, dehydrated, and dried at 40° C. for 16 hours to obtain an MMA macromonomer.

<Production of Copolymer>

A resin composition containing a (meth)acrylic copolymer (nBA/AA/MMa (mass ratio)=81/4/15) was obtained in the same manner as in Example B1, except that, in <Production of copolymer> of Example B1, the initial charged amount of ethyl acetate was changed from 25 parts to 40 parts, the initial charged amount of IPA was changed from 2 parts to 5 parts, 30 parts of the macromonomer solution was changed to 15 parts of the above-described MMA macromonomer (dried state), and 85 parts of nBA was changed to 81 parts of nBA and 4 parts of AA.

Comparative Example B3

A resin composition containing a (meth)acrylic copolymer (nBA/BMA (mass ratio)=85/15) was obtained in the same manner as in Example B1, except that, in <Production of macromonomer> of Example B1, SLMA was changed to BMA, and in <Production of copolymer>, the amount of IPA was changed from 2 parts to 1.5 parts.

Table 3 and Table 4 show the formulation, physical properties (storage modulus G' and amount of strain in the creep test), and molecular weights (Mn and Mw) of the copolymer contained in the resin composition obtained in each example, the molecular weights (Mn and Mw) and glass transition temperature (Tg) of the macromonomer, and the B-type viscosity of the resin composition. In the measurement of the B-type viscosity, ethyl acetate was added to the resin composition as necessary to adjust the concentration of non-volatile content to 50% by mass.

TABLE 3

| | | | Example B1 | Example B2 | Example B3 | Example B4 | Example B5 |
|---|---|---|---|---|---|---|---|
| Formulation of copolymer (% by mass) | Macromonomer (A1) | MMA (C1) | | | | | |
| | | BMA (C4) | | | | | |
| | | EHMA (C8) | | | | 15 | |
| | | SLMA (C12, 13) | 15 | 15 | 15 | | |
| | | iSMA (C18) | | | | | 15 |
| | Vinyl monomer (B) | nBA (C4) | 85 | 77 | 55 | 85 | 85 |
| | | EHA (C8) | | | 26 | | |
| | | SLMA (C12, 13) | | | | | |
| | | AA (—COOH) | | | 4 | | |
| | | 4HBA (—OH) | | 8 | | | |
| Characteristics | Storage modulus G' (kPa) −20° C., 1 Hz | | 163 | 417 | 632 | 405 | 525 |
| | Deformation amount (%) | 23° C., 10 min, 100 Pa | 6.5 | 4.6 | 6.9 | 12.0 | 7.5 |
| | | 70° C., 1 min, 1000 Pa | 351 | 274 | 556 | 1671 | 414 |
| Mn of macromonomer | | | 5,200 | 5,200 | 5,200 | 3,200 | 5,900 |
| Mw of macromonomer | | | 9,400 | 9,400 | 9,400 | 8,000 | 12,300 |
| Tg of macromonomer (° C.) | | | −62 | −62 | −62 | −10 | −18 |
| Mn of copolymer | | | 62,100 | 49,400 | 54,600 | 59,600 | 51,800 |
| Mw of copolymer | | | 496,200 | 426,416 | 453,400 | 498,000 | 353,600 |
| B-type viscosity NV = 50%, 25° C. (mPa · s) | | | 5,560 | 6,250 | 3,140 | 2,580 | 5,700 |

TABLE 4

| | | | Example B6 | Example B7 | Example B8 | Comparative Example B1 | Comparative Example B2 | Comparative Example B3 |
|---|---|---|---|---|---|---|---|---|
| Formulation of copolymer (% by mass) | Macromonomer (A1) | MMA (C1) | | | | | 15 | |
| | | BMA (C4) | 8 | | 4 | | | 15 |
| | | EHMA (C8) | | | 11 | | | |
| | | SLMA (C12, 13) | 7 | 10 | | | | |
| | | iSMA (C18) | | | | | | |
| | Vinyl monomer (B) | nBA (C4) | 85 | 90 | 85 | 85 | 81 | 85 |
| | | EHA (C8) | | | | | | |
| | | SLMA (C12, 13) | | | | 15 | | |
| | | AA (—COOH) | | | | | 4 | |
| | | 4HBA (—OH) | | | | | | |
| Characteristics | Storage modulus G' (kPa) −20° C., 1 Hz | | 335 | 207 | 556 | 155 | 9,001 | 775 |
| | Deformation amount (%) | 23° C., 10 min, 100 Pa | 13.2 | 9.9 | 12.6 | 32.3 | 0.2 | 11.5 |
| | | 70° C., 1 min, 1000 Pa | 702 | 196 | 2147 | 1563 | 34 | 804 |

TABLE 4-continued

| | Example B6 | Example B7 | Example B8 | Comparative Example B1 | Comparative Example B2 | Comparative Example B3 |
|---|---|---|---|---|---|---|
| Mn of macromonomer | 3,800 | 5,200 | 3,600 | — | 2,800 | 3,800 |
| Mw of macromonomer | 9,000 | 9,400 | 8,700 | — | 5,800 | 10,300 |
| Tg of macromonomer (° C.) | −25 | −62 | −3 | — | 105 | 20 |
| Mn of copolymer | 65,400 | 63,000 | 60,400 | 70,800 | 44,400 | 73,200 |
| Mw of copolymer | 543,200 | 523,100 | 482,800 | 524,000 | 194,800 | 532,000 |
| B-type viscosity NV = 50%, 25° C. (mPa · s) | 4,510 | 9,430 | 2,380 | 6,570 | 1,240 | 3,900 |

3. Third Test

Measurement and evaluation in Examples were carried out by the methods shown below. Measurement and evaluation other than shown below were carried out by the same methods as in the first test.

<Unevenness Followability>

(Creep Test)

An operation in which a release film on one side was removed from an adhesive sheet with a release film (pre-UV), which was produced in each example, and the adhesive sheets were laminated using a hand roller was repeated to obtain a laminate in which a plurality of the adhesive sheets were laminated to a thickness of approximately 0.9 mm and the release films were laminated on both sides thereof. The laminate was punched out into a circular shape with a diameter of 8 mm to obtain a sample.

With regard to the above-described sample, the release film was removed, and the sample was placed in a rheometer ("DHR-2" manufactured by TA Instruments.), and a strain (creep strain) (%) of the obtained sample after 600 seconds was measured under a measurement jig of 8 mm-diameter parallel plate, a temperature of 60° C., and a pressure of 2000 Pa.

The creep strain was preferably 1000% or more and more preferably 2000% or more.

<Shape Holding Power>

(Holding Power)

A release film on one side was removed from an adhesive sheet with a release film (pre-UV), which was produced in each example and cut into 40 mm×50 mm, and a PET film (manufactured by Mitsubishi Chemical Corporation, DIAFOIL S-100, thickness: 38 μm) was bonded to the adhesive sheet as a film for backing using a hand roller. The laminate was cut into strips with a width of 20 mm and a length of 100 mm to obtain a test piece. Next, the remaining release film was peeled off, and one end portion of the laminate in a longitudinal direction was adhered to a SUS plate (120 mm×50 mm×1.2 mm in thickness) using a hand roller so that an adhesive area was 20 mm×20 mm. Next, the test piece was cured for 15 minutes in an atmosphere of 40° C., a weight of 500 gf (4.9 N) was attached to the other end portion (un-adhered portion) of the test piece, the SUS plate was placed in a vertical direction such that the weight side was bottom, and a time (seconds) until the weight fell was measured and used as the holding power.

The holding power was preferably 100 seconds or more and more preferably 200 seconds or more.

<Flexibility During Use at Low Temperatures>

(Storage Shear Modulus G')

An operation in which a release film on one side was removed from an adhesive sheet with a release film (post-UV), which was produced in each example, and the adhesive sheets were laminated using a hand roller was repeated to obtain a laminate in which a plurality of the adhesive sheets were laminated to a thickness of approximately 0.9 mm and the release films were laminated on both sides thereof. The laminate was punched out into a circular shape with a diameter of 8 mm to obtain a sample.

With regard to the above-described sample, the release film was removed, and the sample was placed in a rheometer ("DHR-2" manufactured by TA Instruments.), a dynamic viscoelasticity measurement was performed under a measurement jig of 8 mm-diameter parallel plate, a frequency of 1 Hz, a measurement temperature of −50° C. to 150° C., and a temperature rising rate of 5° C./min, and a value of a storage shear modulus G' was read.

The storage shear modulus G' at −20° C. was preferably 220 kPa or less and more preferably 200 kPa or less.

<Adhesive Force>

(Adhesive Force)

A PET film manufactured by Mitsubishi Chemical Corporation, DIAFILM S-100, thickness: 50 μm, contact angle with respect to distilled water: 71°) was subjected to a vacuum plasma treatment as a surface treatment to produce a PET film having a contact angle of 28° with respect to distilled water, and the PET film was bonded to soda-lime glass. The contact angle was measured by a liquid droplet method using an automatic contact angle meter (manufactured by Kyowa Interface Science Co., Ltd., "DM-501") in an environment of a measurement atmosphere of 23° C. and 50% RH. A dropwise amount of distilled water was 2 μL.

A release film on one side was removed from an adhesive sheet with a release film (post-UV), which was produced in each example, and a PET film (manufactured by TOYOBO CO., LTD., COSMOSHINE A4300, thickness: 100 μm) was bonded to the adhesive sheet as a film for backing using a hand roller. The laminate was cut into strips with a width of 10 mm and a length of 150 mm, the remaining release film was peeled off, and the PET film which had been bonded to the soda-lime glass in advance was bonded to the exposed adhesive surface using a hand roller. The obtained laminate was subjected to an autoclave treatment (60° C., gauge pressure of 0.2 MPa, and 20 minutes) for finish bonding, thereby producing a measurement sample of adhesive force.

With regard to the obtained measurement sample of adhesive force, the film for backing was peeled off from the soda-lime glass while pulling at an angle of 1800 at a peeling speed of 300 mm/min under the following condition 1 or condition 2, and a tensile strength was measured with a load cell and used as the adhesive force (N/cm).

Condition 1: 60° C. and 10% RH

Condition 2: 60° C. and 93% RH

The adhesive force under the condition 1 was preferably 1.5 N/cm or more and more preferably 2.0 N/cm or more. The adhesive force under the condition 2 was preferably 1.0 N/cm or more and more preferably 1.5 N/cm or more.

(Used Material)

<Macromonomer (A1)>

SLMA: mixture of lauryl methacrylate and stearyl methacrylate, manufactured by Mitsubishi Chemical Corporation; trade name: Acrylic Ester SL <Alkyl (Meth)Acrylate (B1) Having Alkyl Group Having 6 to 30 Carbon Atoms>

2EHA: 2-ethylhexyl acrylate, manufactured by Mitsubishi Chemical Corporation nOA: n-octyl acrylate, manufactured by OSAKA ORGANIC CHEMICAL INDUSTRY LTD.

<Vinyl Monomer (B2) Having Polar Group>

4HBA: 4-hydroxybutyl acrylate, manufactured by Mitsubishi Chemical Corporation

HEA: 2-hydroxyethyl acrylate, manufactured by NACALAI TESQUE, INC.

<Alkyl (Meth)Acrylate (B3-1)> nBA: n-butyl acrylate, manufactured by Mitsubishi Chemical Corporation

<Initiator>

AMBN: 2,2'-azobis(2-methylbutyronitrile), manufactured by Otsuka Chemical Co., Ltd.

Production Example C1

100 parts of SLMA, 0.00075 parts of bis[(difluoroboryl) diphenylglyoxymate]cobalt(II) as a chain transfer agent, and 58 parts of ethyl acetate were charged into a four-necked flask equipped with a stirrer, a thermometer, a cooling tube, and a nitrogen gas inlet, and oxygen was replaced by nitrogen bubbling. Next, 0.4 parts of AMBN as a polymerization initiator and 2 parts of ethyl acetate were added thereto. Next, the external temperature was raised to 90° C. in a water bath, and the reaction was carried out in a reflux state for 2 hours. Next, 0.2 parts of AMBN and 20 parts of ethyl acetate were added dropwise thereto over 1 hour, and the reflux state was further maintained for 2 hours. Thereafter, the reaction solution was cooled to 40° C. to obtain a solution containing a macromonomer (SLMA-MM). By adding ethyl acetate to the solution, the concentration of non-volatile content was adjusted to 50% by mass.

Example C1

<Production of Copolymer>

25 parts of ethyl acetate as a charged solvent, 1.5 parts of isopropyl alcohol (IPA), and 30 parts of the macromonomer (SLMA-MM) solution obtained in Production Example 1 (concentration of non-volatile content: 50% by mass) were charged into a four-necked flask equipped with a stirrer, a thermometer, a cooling tube, and a nitrogen gas inlet, and the external temperature was raised to 85° C. in a water bath under nitrogen gas ventilation. After the reflux state was stabilized, a mixture consisting of 20 parts of ethyl acetate, 26 parts of nOA (B1), 8 parts of 4HBA (B2), 51 parts of nBA (B3-1), and 0.13 parts of NYPER BK40 MT (manufactured by NOF CORPORATION) was added dropwise thereto over 4 hours. After finishing the dropwise addition and retaining for 1 hour, a mixture consisting of 0.3 parts of PEROCTA O (manufactured by NOF CORPORATION) and 15 parts of ethyl acetate were added thereto over 1 hour. After retaining for 2 hours, 0.5 parts of "IRGANOX 1010" (trade name, manufactured by BASF) as an antioxidant, and 23.5 parts of ethyl acetate were added thereto, and the mixture was cooled to room temperature to obtain a solution containing a (meth)acrylic copolymer (nBA/nOA/4HBA/SLMA-MM (mass ratio)=51/26/8/15) (hereinafter, also referred to as a copolymer solution 1).

<Production and Evaluation of Adhesive Sheet with Release Film>

The copolymer solution 1 in an amount of 100 parts of non-volatile content, 1.5 parts of a crosslinking agent (manufactured by Mitsubishi Chemical Corporation, SHIKOH UV-3700B), 1.5 parts of an initiator (manufactured by IGM Resins, Esacure TZT), and ethyl acetate in an amount such that the total amount with the volatile content in the copolymer solution 1 was 154.5 parts were blended to prepare a resin composition.

The obtained resin composition was developed in a sheet shape on a release film (PET film manufactured by Mitsubishi Chemical Corporation) having a thickness of 100 μm, which had been subjected to a silicone release treatment, such that the thickness of the resin composition was 200 μm. Next, the sheet-shaped resin composition together with the release film was put into a dryer heated to 90° C. and held for 10 minutes to volatilize the solvent in the resin composition. Furthermore, a release film (PET film manufactured by Mitsubishi Chemical Corporation) having a thickness of 75 μm, which had been subjected to a silicone release treatment, was laminated on the sheet-shaped resin composition in which the solvent had been volatilized. As a result, an adhesive sheet with a release film, in which the release films were laminated on both front and back sides of the adhesive sheet (sample) having a thickness of 50 μm, (hereinafter, also referred to as "adhesive sheet with a release film (pre-UV)").

Using a high-pressure mercury lamp, the adhesive sheet with a release film (pre-UV) was irradiated with light having a wavelength of 365 nm through the release film for curing the adhesive sheet. The light irradiation was performed such that an integrated irradiation amount was 4000 mJ/cm$^2$. As a result, a cured adhesive sheet with a release film, in which the release films were laminated on both front and back sides of the adhesive sheet having a thickness of 50 μm, (hereinafter, also referred to as "adhesive sheet with a release film (post-UV)").

The creep strain and holding power of the adhesive sheet with a release film (pre-UV) were evaluated. The storage shear modulus G' and adhesive force of the adhesive sheet with a release film (post-UV) were evaluated.

Examples C2 and C3 and Comparative Examples C1 to C5

A solution containing a copolymer was prepared in the same manner as in Example C1, except that, in <Production of copolymer> of Example C1, the amount of ethyl acetate as the charged solvent, the amount of IPA, the amount of the macromonomer (SLMA-MM) solution, the formulation of the mixture to be added dropwise, and the amount of ethyl acetate added together with PEROCTA O or the antioxidant were charged as shown in Table 5. Thereafter, the adhesive sheet with a release film was produced and evaluated in the same manner as in Example C1.

Table 6 show the type of monomer and molecular weights (Mn and Mw) of the copolymer contained in the resin composition obtained in each example, the concentration of non-volatile content in the resin composition, and the evaluation results of the adhesive sheet with a release film, produced from the resin composition.

TABLE 5

| | | | | Example | | | Comparative Example | | | | |
|---|---|---|---|---|---|---|---|---|---|---|---|
| | | | | C1 | C2 | C3 | C1 | C2 | C3 | C4 | C5 |
| Charged solvent | Ethyl acetate | | Part | 25 | 26 | 33 | 25 | 40 | 25 | 25 | 25 |
| | IPA | | Part | 1.5 | 1 | 1.3 | 2 | 1.2 | 0.5 | 3 | 2 |
| Macromonomer (SLMA-MM) solution | | | Part | 30 | 14 | 14 | 30 | 0 | 30 | 30 | 30 |
| Dropwise addition mixture | Solvent | Ethyl acetate | Part | 20 | 20 | 20 | 20 | 34 | 20 | 20 | 20 |
| | B1 | 2EHA | Part | 0 | 28 | 0 | 0 | 31 | 0 | 0 | 0 |
| | B1 | nOA | Part | 26 | 0 | 28 | 0 | 0 | 26 | 0 | 0 |
| | B2 | 4HBA | Part | 8 | 4 | 8 | 0 | 4 | 0 | 8 | 0 |
| | B2 | HEA | Part | 0 | 0 | 0 | 0 | 0 | 0 | 0 | 6.3 |
| | B3-1 | nBA | Part | 51 | 61 | 57 | 85 | 65 | 59 | 77 | 78.7 |
| Ethyl acetate for diluting PEROCTA | | | Part | 15 | 15 | 15 | 15 | 15 | 15 | 15 | 15 |
| Ethyl acetate for diluting antioxidant | | | Part | 23.5 | 31 | 23.7 | 23 | 9.8 | 24.5 | 22 | 23 |

TABLE 6

| Copolymer (I) | | | | | Example | | | Comparative Example | | | | |
|---|---|---|---|---|---|---|---|---|---|---|---|---|
| | | | | | C1 | C2 | C3 | C1 | C2 | C3 | C4 | C5 |
| Type of monomer | Macromonomer (A1) | | SLMA-MM | wt % | 15 | 7 | 7 | 15 | 0 | 15 | 15 | 15 |
| | Vinyl monomer (B) | B1 | 2EHA | wt % | 0 | 28 | 0 | 0 | 31 | 0 | 0 | 0 |
| | | | nOA | wt % | 26 | 0 | 28 | 0 | 0 | 26 | 0 | 0 |
| | | B2 | 4HBA | wt % | 8 | 4 | 8 | 0 | 4 | 0 | 8 | 0 |
| | | | HEA | wt % | 0 | 0 | 0 | 0 | 0 | 0 | 0 | 6.3 |
| | | B3-1 | nBA | wt % | 51 | 61 | 57 | 85 | 65 | 59 | 77 | 78.7 |
| Molecular weight | Mn | | | g/mol | 56,200 | 61,200 | 53,200 | 58,700 | 95,400 | 60,500 | 49,400 | 59,700 |
| | Mw | | | g/mol | 936,000 | 868,000 | 707,000 | 462,000 | 637,000 | 706,000 | 426,000 | 505,000 |
| Concentration of non-volatile content | | | | % | 52.0 | 51.2 | 51.4 | 50.3 | 51.2 | 51.3 | 51.4 | 51.2 |
| Unevenness followability | Creep strain_60° C. (pre-UV) | | | % | 6,056 | 2,602 | 1,910 | 6,677 | — | 35,184 | 3,712 | 1,423 |
| Shape holding power | Holding power_40° C. (pre-UV) | | | sec | 100 | 236 | 304 | 101 | 58.0 | 44 | 169 | 477 |
| Flexibility during use at low temperatures | G'_−20° C. (post-UV) | | | kPa | 212 | 209 | 188 | 240 | — | 169 | 321 | 379 |
| Adhesive force (post-UV) | Condition 1: 60° C., 10% RH | | | N/cm | 2.5 | 2.4 | 2.5 | 1.3 | — | 0.5 | 3.8 | 3.4 |
| | Condition 2: 60° C., 93% RH | | | N/cm | 1.9 | 1.2 | 1.9 | 0.7 | — | 0.3 | 2.6 | 3.2 |

In the adhesive sheets formed from the resin compositions of Examples C1 to C3, it was found that, since the creep strain at 60° C. was 100000 or more, the deformation at high temperatures easily occurred, and the unevenness followability during bonding was excellent. In addition, it was found that, since the holding power at 40° C. was 100 seconds or more, the deformation was less likely to occur at normal temperature, and the shape holding power was excellent. In addition, it was found that, since the storage shear modulus G' at −20° C. was 220 kPa or less, the flexibility during use at the low temperatures was excellent. Furthermore, the adhesive force was also favorable.

On the other hand, in the adhesive sheet formed from the resin composition of Comparative Example C1, in which the copolymer did not have the constituent unit derived from the alkyl (meth)acrylate (B1) and the constituent unit derived from the vinyl monomer (B2), as compared with Examples C1 to C3, the flexibility during use at the low temperatures and the adhesive force were deteriorated.

In the adhesive sheet formed from the resin composition of Comparative Example C2, in which the copolymer did not have the constituent unit derived from the macromonomer (A1), the shape holding power at normal temperature was deteriorated.

In the adhesive sheet formed from the resin composition of Comparative Example C3, in which the copolymer did not have the constituent unit derived from the vinyl monomer (B2), the shape holding power at normal temperature and the adhesive force were deteriorated.

In the adhesive sheets formed from the resin compositions of Comparative Examples C4 and C5, in which the copolymer did not have the constituent unit derived from the alkyl (meth)acrylate (B1), the flexibility during use at the low temperatures was deteriorated.

What is claimed is:

1. An adhesive sheet comprising:

an adhesive layer formed from an adhesive composition containing a (meth)acrylic copolymer, wherein the (meth)acrylic copolymer is a (meth)acrylic copolymer containing a structural unit derived from an alkyl (meth)acrylate having an alkyl group with 8 to 30 carbon atoms, wherein the following requirements (1) to (3) are satisfied, (1) when a thickness is set to 0.7 to 1.0 mm, a strain (creep strain) by applying a pressure of 2 kPa at a temperature of 60° C. for 600 seconds is 1000% or more and 100000% or less, (2) in a holding power measurement in accordance with JIS-Z-0237 (ISO29863), a falling time when the adhesive sheet is adhered to a SUS plate with an area of 20 mm×20 mm and a load of 500 gf is applied in an atmosphere of 40° C. is 60 seconds or more, (3) when a thickness is set to 0.7 to 1.0 mm, a storage shear modulus at −20° C. (G' (−20° C.)) obtained by a dynamic viscoelasticity measurement in a shear mode at a frequency of 1 Hz is 10 kPa or more and 1000 kPa or less.

2. The adhesive sheet according to claim 1, wherein the (meth)acrylic copolymer is a block copolymer or a graft copolymer.

3. The adhesive sheet according to claim 2, wherein a proportion of the constituent unit derived from the alkyl (meth)acrylate (a) to 100% by mass of all constituent units constituting the segment (A) is 70% by mass or more.

4. The adhesive sheet according to claim 2, wherein the (meth)acrylic copolymer has a segment (A) having a constituent unit derived from a macromonomer (A1), and the macromonomer (A1) includes the constituent unit derived from the alkyl (meth)acrylate (a).

5. The adhesive sheet according to claim 2, wherein the (meth)acrylic copolymer includes, as a constituent unit other than the segment (A), a constituent unit derived from a vinyl monomer (B), and the constituent unit derived from the vinyl monomer (B) includes a constituent unit derived from an alkyl (meth) acrylate (B1) having an alkyl group having 6 or more and 30 or less carbon atoms and a constituent unit derived from a vinyl monomer (B2) including a polar group.

6. The adhesive sheet according to claim 1, wherein the (meth)acrylic copolymer includes a constituent unit derived from an alkyl (meth)acrylate (a) having an alkyl group having 8 or more and 30 or less carbon atoms and a constituent unit derived from a vinyl monomer (B) other than the alkyl (meth)acrylate (a), and the constituent unit derived from the vinyl monomer (B) includes a constituent unit derived from a vinyl monomer (B2) including a polar group.

7. The adhesive sheet according to claim 1, wherein the adhesive layer is a layer formed from an adhesive composition which contains a (meth)acrylic copolymer and at least one of a crosslinking agent and a photopolymerization initiator.

8. The adhesive sheet according to claim 7, wherein the crosslinking agent is a polyfunctional (meth) acrylate.

9. The adhesive sheet according to claim 7, wherein the amount of the crosslinking agent is 0.1 parts by mass or more and 10 parts by mass or less with respect to 100 parts by mass of the (meth)acrylic copolymer.

10. The adhesive sheet according to claim 1, wherein the adhesive layer has active energy ray-curability, and the following requirements (4) and (5) are satisfied after curing the adhesive sheet with active energy ray, (4) when the adhesive sheet is irradiated with active energy ray having a wavelength of 365 nm with an integrated light amount of 1000 to 5000 mJ/cm$^2$, a storage shear modulus at −20° C. (G' (−20° C.)) obtained by a dynamic viscoelasticity measurement in a shear mode at a frequency of 1 Hz is 10 kPa or more and 1000 kPa or less, (5) when the adhesive sheet is irradiated with active energy ray having a wavelength of 365 nm with an integrated light amount of 1000 to 5000 mJ/cm$^2$, and then the irradiated adhesive sheet is bonded to a polyester film, an adhesive force to a surface of the polyester film at 60° C., 93% RH, a peeling angle of 180°, and a peeling speed of 300 mm/min is 0.7 N/cm or more.

11. An adhesive composition comprising:

a (meth)acrylic copolymer having a constituent unit derived from a macromonomer (A1) and a constituent unit derived from a vinyl monomer (B), wherein the macromonomer (A1) has a constituent unit derived from an alkyl (meth)acrylate (a) having an alkyl group having 8 or more and 30 or less carbon atoms, and a glass transition temperature (Tg) of the macromonomer (A1) is lower than 0° C.

12. The adhesive composition according to claim 11, wherein the constituent unit derived from the vinyl monomer (B) includes a constituent unit derived from an alkyl (meth) acrylate having an alkyl group having 6 or more carbon atoms.

13. The adhesive composition according to claim 11, wherein the (meth)acrylic copolymer includes a constituent unit derived from a vinyl monomer (B2) including a polar group.

14. The adhesive composition according to claim 11, wherein a proportion of the constituent unit derived from the macromonomer (A1) to 100% by mass of all constituent units constituting the (meth)acrylic copolymer is 1% to 30% by mass.

15. The adhesive composition according to claim 11, wherein the constituent unit derived from the macromonomer (A1) includes a constituent unit derived from an alkyl (meth)acrylate (a1) having an alkyl group having 12 or more and 30 or less carbon atoms.

16. The adhesive composition according to claim 15, wherein a proportion of the constituent unit derived from the alkyl (meth)acrylate (a1) to 100% by mass of all constituent units constituting the macromonomer (A1) is 40% by mass or more.

17. The adhesive composition according to claim 11, wherein the constituent unit derived from the vinyl monomer (B) includes a constituent unit derived from an alkyl (meth)acrylate (B1) having an alkyl group having 6 or more and 30 or less carbon atoms, and a proportion of the constituent unit derived from the alkyl (meth)acrylate (B1) to 100% by mass of all constituent units constituting the (meth)acrylic copolymer is 10% by mass or more.

18. The adhesive composition according to claim 11, wherein the constituent unit derived from the vinyl monomer (B) includes a constituent unit derived from an alkyl (meth)acrylate (B3-1) having an alkyl group having 1 to 4 carbon atoms.

19. The adhesive composition according to claim 18, wherein a proportion of the constituent unit derived from the alkyl (meth)acrylate (B3-1) to 100% by mass of all constituent units derived from the vinyl monomer (B) is 50% by mass or more.

20. The adhesive composition according to claim 13, wherein a proportion of the constituent unit derived from the vinyl monomer (B2) including a polar group to 100% by mass of all constituent units constituting the (meth)acrylic copolymer is 1% to 80% by mass.

21. The adhesive composition according to claim 11, wherein a number-average molecular weight of the macromonomer (A1) is 1,000 to 30,000.

22. The adhesive composition according to claim 11, wherein a weight-average molecular weight of the (meth) acrylic copolymer is 50,000 to 2,000,000.

23. The adhesive composition according to claim 11, wherein a deformation amount of the (meth)acrylic copolymer is 15% or less in a creep test under conditions of 23° C., 100 Pa, and 10 minutes, a deformation amount of the (meth)acrylic copolymer is 100% or more in a creep test under conditions of 70° C., 1000 Pa, and 1 minute, and a storage modulus G' of the (meth)acrylic copolymer at −20° C. and 1 Hz is 700 kPa or less.

24. The adhesive composition according to claim 11, wherein the adhesive composition is for bonding a member having unevenness on a surface and a member having an organic light emitting diode.

25. An adhesive sheet comprising:

an adhesive layer composed of the adhesive composition according to claim 11.

26. An adhesive sheet with a release film, comprising:

the adhesive sheet according to claim 1; and a release film laminated on at least one surface of the adhesive sheet.

27. A laminate for an image display device, comprising:

two members for constituting an image display device; and the adhesive sheet according to claim 1, wherein the two members are laminated through the adhesive sheet, and at least one of the members for constituting an image display device has a step with a height difference of 2 μm or more on a contact surface with the adhesive sheet.

28. A flexible image display device comprising:

the laminate for an image display device according to claim 27.

* * * * *